United States Patent [19]
Hasegawa et al.

[11] Patent Number: 5,726,930
[45] Date of Patent: Mar. 10, 1998

[54] SEMICONDUCTOR MEMORY DEVICE

[75] Inventors: Masatoshi Hasegawa, Ome; Kazuhiko Kajigaya, Iruma; Kan Takeuchi; Katsumi Matsuno, both of Kokubunji; Osamu Nagashima, Hamura, all of Japan

[73] Assignee: Hitachi, Ltd., Tokyo, Japan

[21] Appl. No.: 653,236

[22] Filed: May 24, 1996

[30] Foreign Application Priority Data

Jun. 15, 1995 [JP] Japan .................. 7-174296

[51] Int. Cl.⁶ .................................. G11C 11/22
[52] U.S. Cl. .................................. 365/145; 365/149
[58] Field of Search .................... 365/145, 149

[56] References Cited

U.S. PATENT DOCUMENTS

| | | | |
|---|---|---|---|
| 5,010,518 | 4/1991 | Toda | 365/145 |
| 5,297,077 | 3/1994 | Imai et al. | 365/145 |
| 5,455,786 | 10/1995 | Takeuchi et al. | 365/145 |

FOREIGN PATENT DOCUMENTS 3-283176  12/1991  Japan.

Primary Examiner—Joseph A. Popek
Attorney, Agent, or Firm—Antonelli, Terry, Stout, & Kraus, LLP

[57] ABSTRACT

A semiconductor memory device capable of simultaneously providing volatile and non-volatile portions is disclosed having a plurality of memory mats, and a plurality of plate electrodes and a plurality of memory mats each provided in one-to-one correspondence with the memory maps. The memory mats each include a plurality of word lines, a plurality of bit lines and a plurality of memory cells provided at the intersections of the word lines and the bit lines. The memory cells each include an information storage capacitor having a ferroelectric film, and an address selection MOSFET. The information storage capacitor has a pair of electrodes, one of which is connected to the plate electrode that corresponds to the memory mat in which the information storage capacitor is included. A first voltage or a second voltage is selectively applied to each of the plate electrodes according to data held in the memory circuit corresponding to the plate electrode. When the first voltage is applied to the plate electrode, the information storage capacitors connected to the plate electrode are made incapable of polarization reversal irrespective of a binary write signal given to the bit lines. When the second voltage is applied to the plate electrode, the information storage capacitors connected to the plate electrode are made capable of polarization inversion in response to a binary write signal given to the bit lines.

14 Claims, 11 Drawing Sheets

SEMICONDUCTOR MEMORY DEVICE

BACKGROUND OF THE INVENTION

The present invention relates to a semiconductor memory device and more particularly to a technology suitably applied to random access memories (RAMs) that use ferroelectric capacitors as a memory means.

A memory using a ferroelectric, or a ferroelectric random access memory (hereinafter referred to simply as FERAM), is a nonvolatile memory that stores information as the direction of polarization of the ferroelectric. The memory cell of FERAM, as in a conventional dynamic random access memory (simply referred to as DRAM), has one address selection MOSFET and an information storage capacitor. To write nonvolatile information in a desired memory cell, the MOSFET is turned on, one of the electrodes of the capacitor is connected to a bit line, and a write signal of 0 V or Vcc is supplied. At this time, because the plate electrode, the other electrode of the capacitor, has a potential of Vcc/2, the ferroelectric film of the capacitor is impressed with a voltage, resulting in polarization corresponding to the nonvolatile information. The direction of polarization, which is a characteristic of the ferroelectric film, is not lost even when the power supply is cut off.

To read the nonvolatile information from the memory cell, the bit line is charged to, say, 0 V, brought to a floating state, and then the MOSFET is turned on. Because the plate electrode potential is Vcc/2, an electric field is applied to the selected ferroelectric film of the capacitor. The direction of the electric field is always the same and, according to the nonvolatile information, the polarization of the ferroelectric is maintained as it is, or inverted. When the polarization is inverted, a large current flows out of the memory cell. This current is detected in a manner disclosed in Japan Patent Laid-Open No. 283176/1991, to read the nonvolatile information.

To solve the problems of deterioration of ferroelectric film caused by inverting the polarization and of reduction of the readout speed, the above laid-open patent application proposes the following means. During the normal operation, the plate voltage is set to, for example, Vcc to use the memory as a DRAM and, before cutting off power, the above-mentioned FERAM write operation is performed to store the information as nonvolatile one. Setting the plate voltage to Vcc prevents the capacitor polarization from being inverted for either 0 V potential of the capacitor storage portion or Vcc. This solves the problem of deterioration of the ferroelectric film due to inversion of polarization and also the problem of reduction of the readout speed. When power is turned on, the nonvolatile information is read by the FERAM operation. This process in effect causes the memory cell to function as a nonvolatile memory.

SUMMARY OF THE INVENTION

The memory device of the type using both a DRAM and an FERAM, however, has a drawback that the operation of shifting from volatile information to nonvolatile information is complicated and that its the use is inconvenient in such data processing systems as microcomputers. That is, after information is read from all the memory cells by the DRAM operation, this memory device is required to store the information as nonvolatile information by the FERAM operation. These operations are very difficult to perform quickly, particularly when the power is inadvertently cut off.

Considering the fact that not all the information on the system need to be made nonvolatile before the information is stored and that the memory capacity tends to increase rapidly with the advance of semiconductor technology, the inventors of this invention came up with an idea of dividing the memory into a nonvolatile portion and a volatile portion according to the system or the kind of data processing to be performed.

The object of this invention is to provide a semiconductor memory device which can be conveniently used for a signal processor that performs data processing. These and other objects and novel features of this invention will become apparent from the description of this specification and the accompanying drawings.

Representatives of the inventions disclosed in this specification will be summarized as follows.

According to the first embodiment of this invention, the semiconductor memory device of the invention comprises:

a plurality of memory mats;

a plurality of plate electrodes provided in one-to-one correspondence with the memory mats; and a plurality of memory circuits provided in one-to-one correspondence with the memory mats;

wherein the memory mats each include a plurality of word lines, a plurality of bit lines and a plurality of memory cells provided at the intersections of the word lines and the bit lines;

wherein the memory cells each include an information storage capacitor having a ferroelectric film, and an address selection MOSFET;

wherein the information storage capacitor has a pair of electrodes, one of which is connected to the plate electrode that corresponds to the memory mat in which the information storage capacitor is included;

wherein a first voltage or a second voltage is selectively applied to each of the plate electrodes according to data held in the memory circuit corresponding to the plate electrode;

wherein, when the first voltage is applied to the plate electrode, the information storage capacitors connected to the plate electrode are made incapable of polarization inversion irrespective of a binary write signal given to the bit lines;

wherein, when the second voltage is applied to the plate electrode, the information storage capacitors connected to the plate electrode are made capable of polarization inversion in response to a binary write signal given to the bit lines.

According to the second embodiment of this invention, the semiconductor memory device of the invention comprises:

(1) a first memory mat including a plurality of first word lines, a plurality of first bit lines, and a plurality of first memory cells provided at the intersections of the plurality of first word lines and the plurality of first bit lines;

(2) a first memory mat including a plurality of second word lines, a plurality of second bit lines, and a plurality of first memory cells provided at the intersections of the plurality of second word lines and the plurality of second bit lines;

(3) a first selection circuit connected to the plurality of first bit lines;

(4) a second selection circuit connected to the plurality of second bit lines;

(5) a first memory circuit provided corresponding to the first memory mat; and (6) a second memory circuit provided correspondingly to the second memory mat;

wherein the plurality of first memory cells each include a first selection MOSFET and a first capacitor being polarizable and having a pair of electrodes;

wherein one of the paired electrodes of the first capacitor is connected to either the source or drain of the first selection MOSFET;

wherein the plurality of second memory cells each include a second selection MOSFET and a second capacitor being polarizable and having a pair of electrodes;

wherein one of the paired electrodes of the second capacitor is connected to either the source or drain of the second selection MOSFET;

wherein when data held in the first memory circuit is a first data, the first selection circuit applies a first voltage or a second voltage to the plurality of first bit lines;

wherein when data held in the first memory circuit is a second data, the first selection circuit applies a third voltage or a fourth voltage to the plurality of first bit lines;

wherein when data held in the second memory circuit is the first data, the second selection circuit applies the first voltage or the second voltage to the plurality of second bit lines;

wherein when data held in the second memory circuit is the second data, the second selection circuit applies the third voltage or the fourth voltage to the plurality of second bit lines.

According to the third embodiment of this invention, the semiconductor memory device of the invention comprises:

(1) a first memory mat including a plurality of first word lines, a plurality of first bit lines, and a plurality of first memory cells provided at the intersections of the plurality of first word lines and the plurality of first bit lines;

(2) a first memory mat including a plurality of second word lines, a plurality of second bit lines, and a plurality of first memory cells provided at the intersections of the plurality of second word lines and the plurality of second bit lines;

(3) a first interconnection provided correspondingly to the first memory mat;

(4) a second interconnection provided correspondingly to the second memory mat;

(5) a first control circuit connected to the first interconnection;

(6) a second control circuit connected to the second interconnection;

(7) a first memory circuit provided correspondingly to the first memory mat; and (8) a second memory circuit provided correspondingly to the second memory mat;

wherein the plurality of first memory cells each include a first selection MOSFET and a first capacitor being polarizable and having a pair of electrodes;

wherein one of the paired electrodes of the first capacitor is connected to either the source or drain of the first selection MOSFET and the other of the paired electrodes of the first capacitor is connected to the first interconnection;

wherein the plurality of second memory cells each include a second selection MOSFET and a second capacitor being polarizable and having a pair of electrodes;

wherein one of the paired electrodes of the second capacitor is connected to either the source or drain of the second selection MOSFET and the other of the paired electrodes of the second capacitor is connected to the second interconnection;

wherein the first control circuit applies a first voltage or a second voltage to the first interconnection according to the data held in the first memory circuit;

wherein the second control circuit applies the first voltage or the second voltage to the second interconnection according to the data held in the second memory circuit.

With the means of the first to third embodiments, because the nonvolatile area and the volatile area can be programmably set in a single semiconductor memory device according to the kind of the data handled, what is needed in the data storage procedure is to simply store the data in a predetermined storage area corresponding to the kind of data. This realizes a semiconductor memory device having a nonvolatile memory function and used conveniently.

DESCRIPTION OF THE PREFERRED EMBODIMENTS

Figure 1:
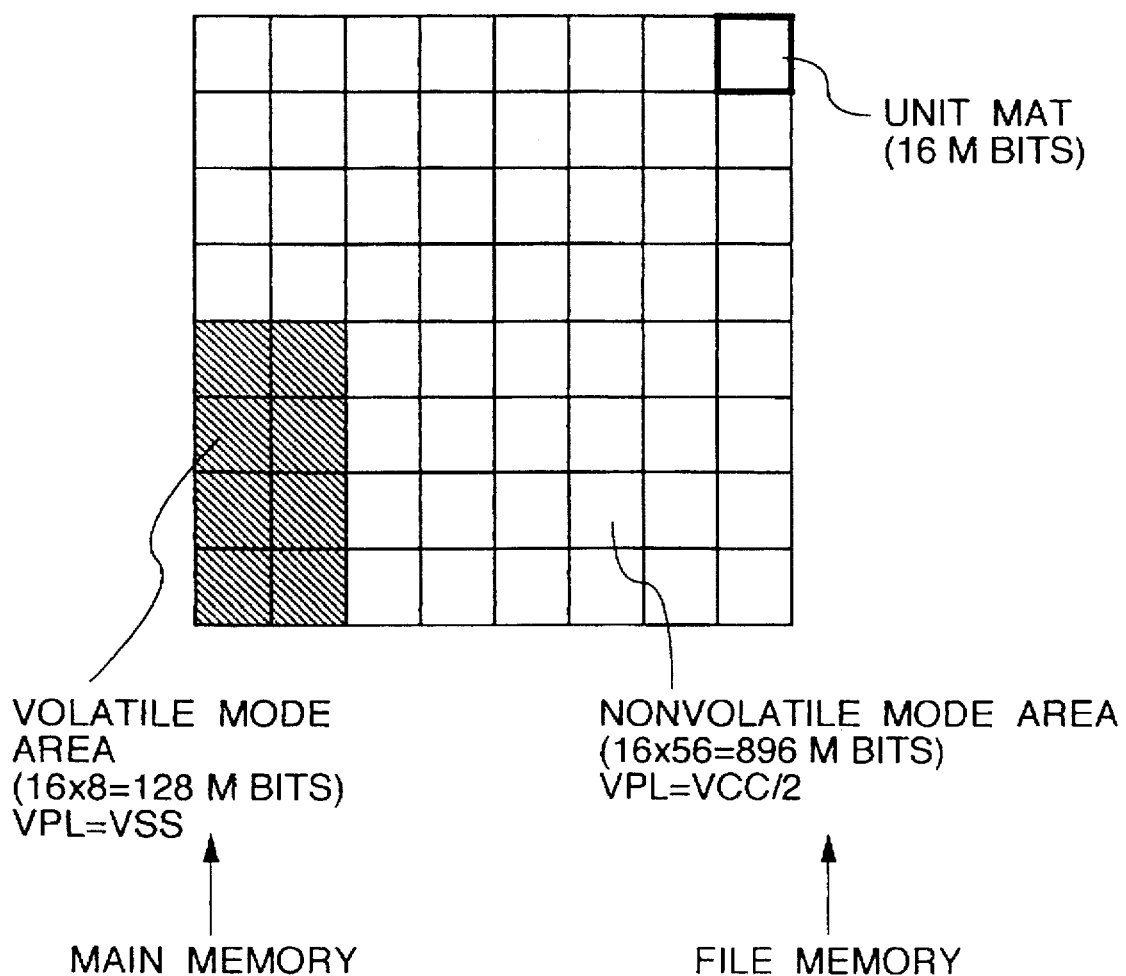
FIG. 1 is a schematic structural view showing one embodiment of a semiconductor memory device of this invention.

FIG. 1 shows a schematic structural view of one embodiment of the semiconductor memory device to which the present invention is applied. The semiconductor memory device of this embodiment has a large memory capacity of 1 giga bits (Gbits) in all. In a system that the memory is accessed in units of 8 bits (1 byte), this semiconductor memory device can be used as a memory device of about 128 mega bytes (M byte).

In this embodiment, the memory array is divided into a plurality of memory mats. One unit mat has a memory capacity of 16 Mbits. The memory device has a total of 64 memory mats to have a memory capacity of 1 Gbits. Because the memory access is carried out in units of 1 byte, the unit mats each store data of 2M bytes.

In this embodiment, a plate voltage VPL supplied to each of the plate electrodes of a total of 64 memory mats is set to either 0 V such as VSS, or to an intermediate voltage such as Vcc/2. Eight memory mats shaded in the drawing are made to operate as normal DRAMs when the VPL is set to VSS, and are used as volatile areas. The remaining 56 memory mats, for which VPL is set to Vcc/2, are made to operate as FERAMs and used as nonvolatile areas. The volatile areas that are made to operate as DRAMs are used as a main memory in a microcomputer of a relatively small scale, while the nonvolatile areas that are made to operate as FERAMs are used as a file memory.

Figure 2:
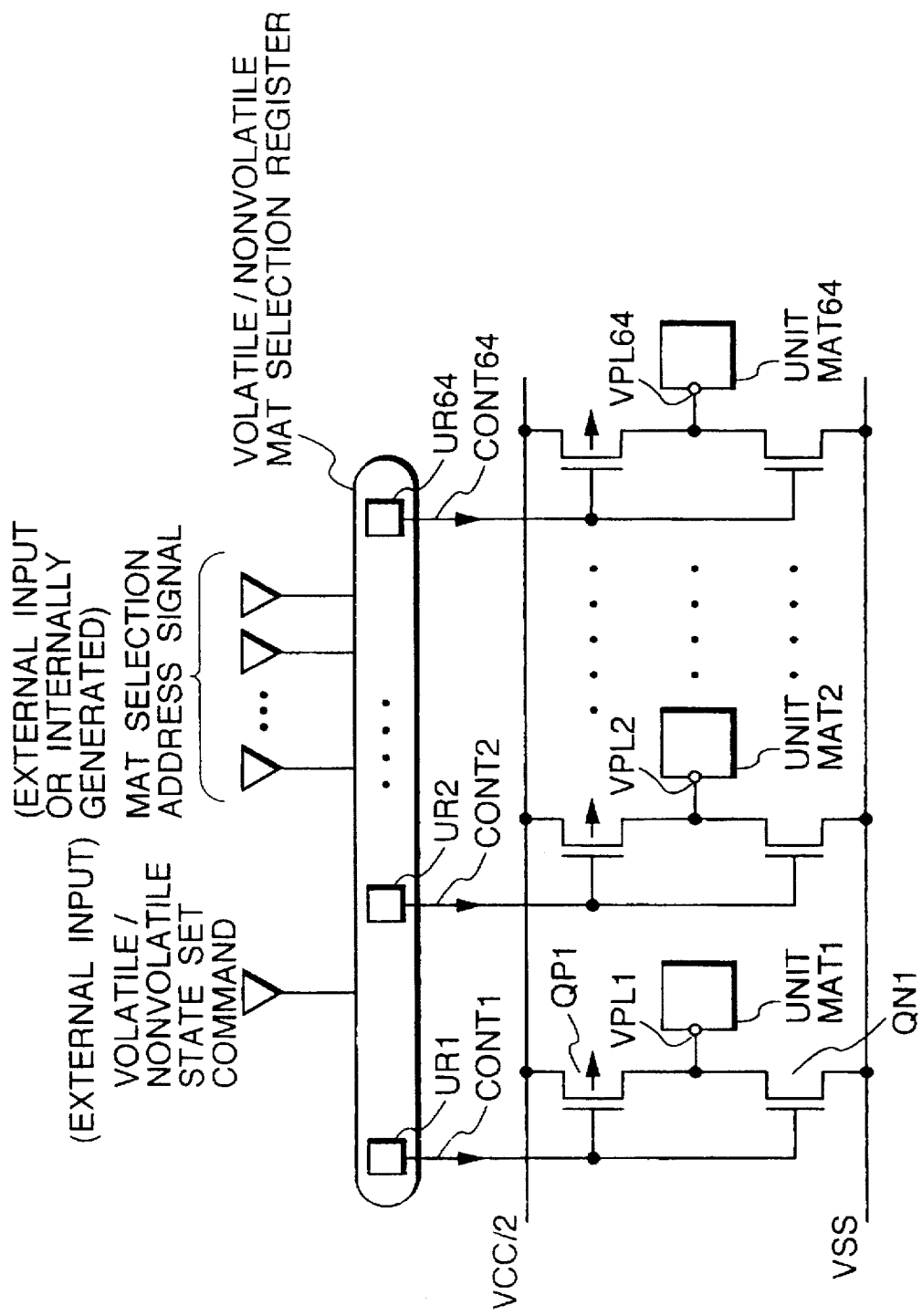
FIG. 2 is a schematic block diagram showing one embodiment of a memory mat potential setting circuit in the semiconductor memory device of this invention.

FIG. 2 shows a schematic block diagram of one embodiment of a memory mat potential setting circuit in the semiconductor memory device of this invention. For each of the plate electrodes in the unit mat 1 to unit mat 64, there are provided a P-channel MOSFET that is supplied with an intermediate voltage such as Vcc/2 and an N-channel MOSFET that is supplied with a circuit ground potential VSS. The gates of the paired P-channel MOSFETs and N-channel MOSFETs are commonly supplied with control signals CONT1–CONT64 that are sent from unit registers (memory circuits) UR1–UR64 contained in volatile/nonvolatile mat selection registers. When, for example, the control signal CONT1 is high, the N-channel MOSFET QN1 is turned on to apply a ground potential such as VSS to the plate electrode VPL1 of the unit mat 1. When the control signal CONT1 is low, the P-channel MOSFET QP1 is turned on to give an intermediate voltage such as virtual Vcc/2 to the plate electrode VPL1 of the unit mat 1.

Similarly, according to the level of the control signals CONT2–CONT64, the plate electrodes VPL2–VPL64 of the unit mats 2–64 are applied either with a ground potential or an intermediate voltage, substantially Vcc/2.

The volatile/nonvolatile mat selection register receives and holds the above-mentioned high/low control signals for the individual unit mats, according to a volatile/nonvolatile set command externally entered and a mat selection address signal externally entered or internally generated. In this configuration, the control signal specifying the volatile/ nonvolatile mode of operation for every unit mat is input according to the initial setting upon turning on the power. The initial setting upon every power-on can be performed automatically by providing a function to generate the internal mat selection address signal and storing the control signals in the nonvolatile memory cells according to the mat selection address signals.

Figure 3:
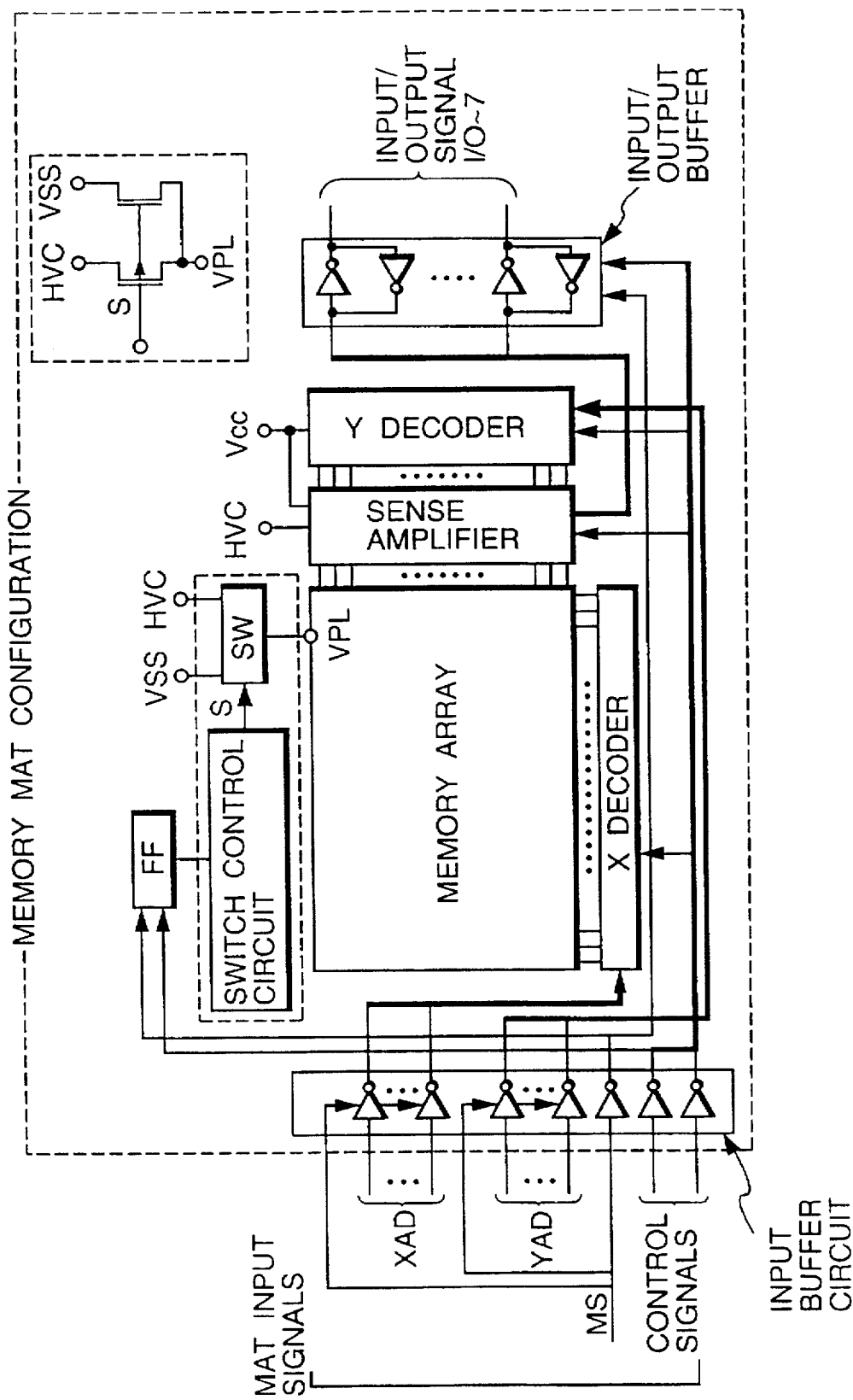
FIG. 3 is a block diagram showing one embodiment of a memory mat in the semiconductor memory device of this invention.

FIG. 3 shows a block diagram of a memory mat of one embodiment in the semiconductor memory device of this invention. Although the memory mats MAT0–MAT64 are formed on a single semiconductor substrate, they each have an input buffer for address signals and control signals and an input/output buffer for data so that each memory mat can be deemed as a single semiconductor memory. That is, input signals supplied from external terminals are taken in through the common input buffer in the semiconductor memory device. Of these input signals, address signals other than those forming the memory mat selection signal MS are sent to the input buffer and input/output buffer of each memory mat through the address bus. Therefore, an input buffer is provided to take in address signals XAD and YAD supplied through the above-mentioned internal bus, the memory mat selection signal MS, and various control signals formed by the control circuit CONT.

The reason is that the configuration allows an efficient layout for a memory device with a memory capacity of as much as about 1 Gbits and can reduce the number of signal lines extending relatively long distances, the signal transfer speed can be increased. In addition to this, specifying the volatile/nonvolatile for every unit mat is convenient. That is, the plate voltage VPL supplied to the plate electrode of the memory array is selected from the circuit ground potential VSS and a half precharge voltage HVC set to Vcc/2 by a switch SW comprising a P-channel MOSFET and an N-channel MOSFET as exemplarily shown.

The memory circuit comprises, for instance, a flip-flop FF and is used as a volatile/nonvolatile mat selection register. This flip-flop circuit FF stores a binary signal, 1 or 0 corresponding to volatile or nonvolatile. The switch control circuit generates a control signal S for the switch circuit SW according to the stored signal. The setting of the volatile/ nonvolatile is performed externally by a software in a particular mode setting operation specified by a group of control signals, by writing the stored information in the one specified by the memory mat selection signal MS.

The memory circuit may comprise a memory means, such as a fuse, that is programmable only once. In this case, the volatile/nonvolatile state of each memory mat is set when the semiconductor memory device is completed on the semiconductor wafer, with no later modification allowed. Instead of a fuse, the memory circuit may comprise a means.

The address signal XAD that has passed through the input buffer is sent to an X decoder, where it selects one word line in the memory array. The X decoder includes a word line driver. The address signal YAD that has passed through the input buffer is sent to a Y decoder, where a Y selection signal for 8-pair complementary bit line in the memory array is generated. The Y selection signal is sent to a column switch that connects the memory array complementary bit line contained in the sense amplifier to the input/output line, which is connected correspondingly to the input/output buffer.

This embodiment is also provided with redundant circuits, though not shown, for X and Y systems. The X system redundant circuit includes a memory circuit to store a defective address, and an address comparison circuit. When the address comparison circuit compares the input X address and the stored defective address and they do not agree with each other, an word line corresponding to the input address is selected. When the defective address and the input X address agree with each other, the selection of the defective word line of the normal circuit is inhibited and a selection signal that selects a spare word line is output. A similar circuit is also provided in the Y system circuit. When it detects a memory access to a defective bit line, the selection of the defective bit line by the Y decoder is stopped and a selection signal that selects a spare bit line is produced.

Figure 4:
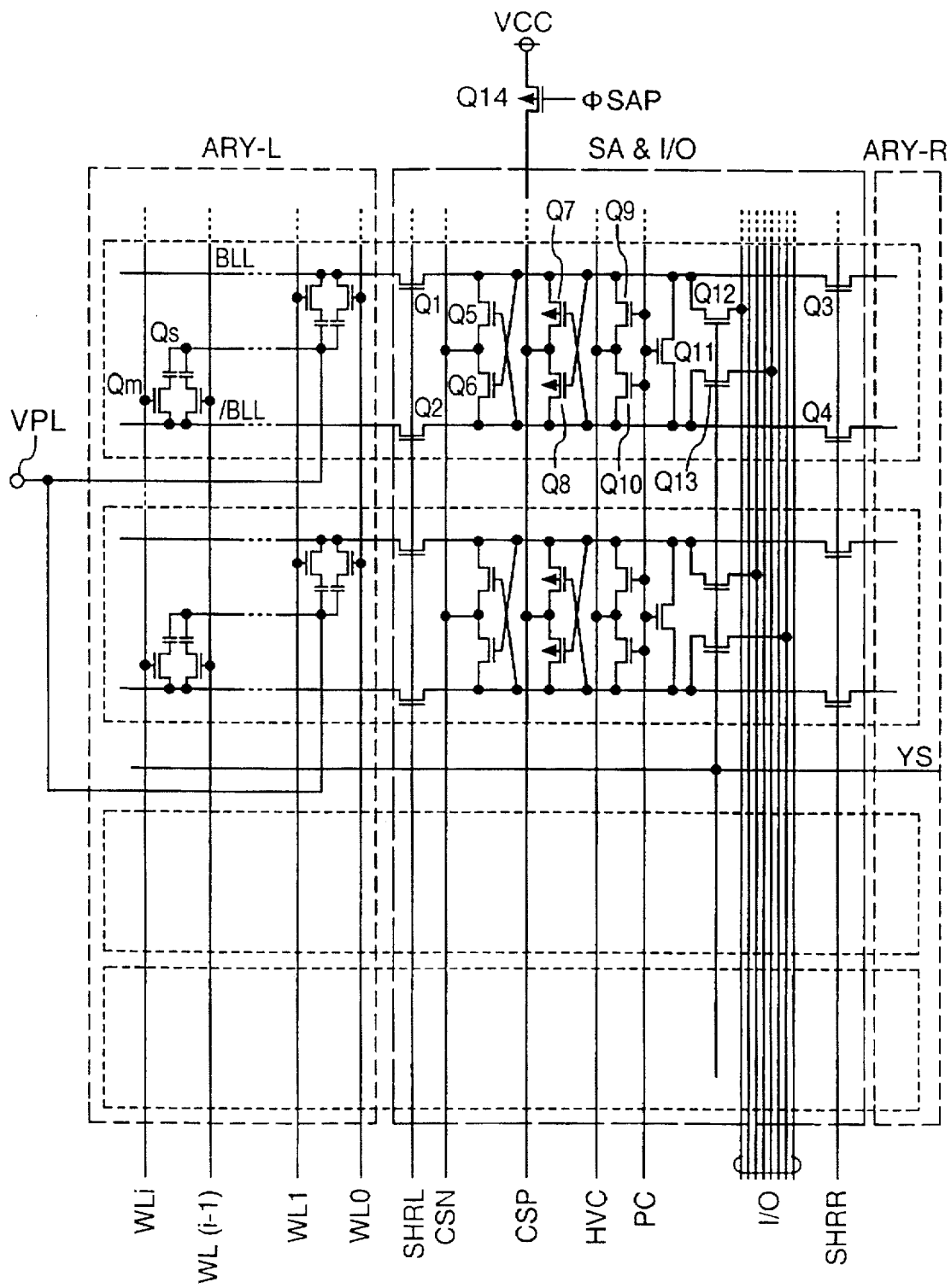
FIG. 4 is a circuit diagram of an essential part, showing one embodiment of a memory array in the memory mat of FIG. 3.

FIG. 4 shows an essential part of the circuit of the memory array of one embodiment. In the figure, four word lines, two pairs of complementary bit lines, and associated sense amplifier and precharge circuit are representatively shown. The configuration shown is a so-called shared sense system, in which memory arrays ARY-L and ARY-R are arranged on the left and right side of the sense amplifier located at the center. The array ARY-L on the left is shown in detail while the right-hand side array ARY-R is shown as a black box. Circuit symbols are assigned only to the MOSFETs making up the circuit corresponding to the pair of complementary bit lines BLL and /BLL representatively.

The memory cell comprises an address selection MOSFET Qm and an information storage capacitor Cs. The gate of the address selection MOSFET Qm is connected to a word line WLi, the drain of this MOSFET Qm to the bit line /BLL, and the source to the information storage capacitor Cs. The other electrodes of the information storage capacitors Cs are commonly applied with the plate voltage VPL through the plate electrode (plate interconnection) VPL. The information storage capacitor Cs uses a ferroelectric film as its dielectric film. The plate electrode VPL is supplied with either HVC (=Vcc/2) or Vcc (=0 V) through the switch SW comprising a P-channel MOSFET and an N-channel MOSFET.

The bit lines BLL and /BLL are arranged parallel as shown and, to establish balance of bit line capacity, are made to cross each other as required. The complementary bit lines BLL and /BLL are connected to input/output nodes of the sense amplifier through the switches MOSFET Q1 and Q2. The sense amplifier comprises N-channel MOSFETs Q5, Q6 and P-channel MOSFETs Q7, Q8 whose gates and drains are cross-connected into a latch form. The sources of the N-channel MOSFETs Q5, Q6 are connected to a common source line CSN. The sources of the P-channel MOSFETs Q7, Q8 are connected to a common source line CSP. As exemplarily shown by the common source line CSP, a power switch MOSFET Q14 of P-channel MOSFET is provided and turned on when a timing signal φSAP is held low, to supply voltage required for the operation of the sense amplifier. The common source line CSN corresponding to the N-channel MOSFETs Q5, Q6 is provided with an N-channel MOSFET not shown to supply the circuit ground potential at the operation timing of the line.

The power switch MOSFETs for activating the sense amplifier are operated as follows. For stable operation of the sense amplifier, when the sense amplifier starts the amplification operation, a power switch MOSFET that can only supply a relatively small current is turned on. As the potential difference between the bit lines BLL and /BLL becomes large by the amplification operation of the sense amplifier, a power switch MOSFET that supplies a large current is turned on, thus performing stepwise amplification. The input/output nodes of the sense amplifier are provided with a precharge circuit that comprises a MOSFET Q11 for shorting the complementary bit lines and switch MOSFETs Q9, Q10 for supplying the half precharge voltage HVC to the complementary bit lines. The gates of the MOSFETs Q9–Q11 are commonly supplied with a precharge signal PC.

The MOSFETs Q12 and Q13 form a column switch that is controlled by a column selection signal YS. In this embodiment, one column selection signal YS selects eight pairs of bit lines. Hence, the column selection signal YS is commonly supplied to the gates of the MOSFETs that form the column switches provided at eight input/output nodes of the sense amplifier corresponding to the two pairs of bit lines exemplarily shown in the figure and the other six pairs of bit lines not shown. Through these switch MOSFETs, the eight pairs of bit lines are connected to the eight pairs of input/output lines that correspond to the input/output signal I/O0–7 of FIG. 3.

Figure 5:
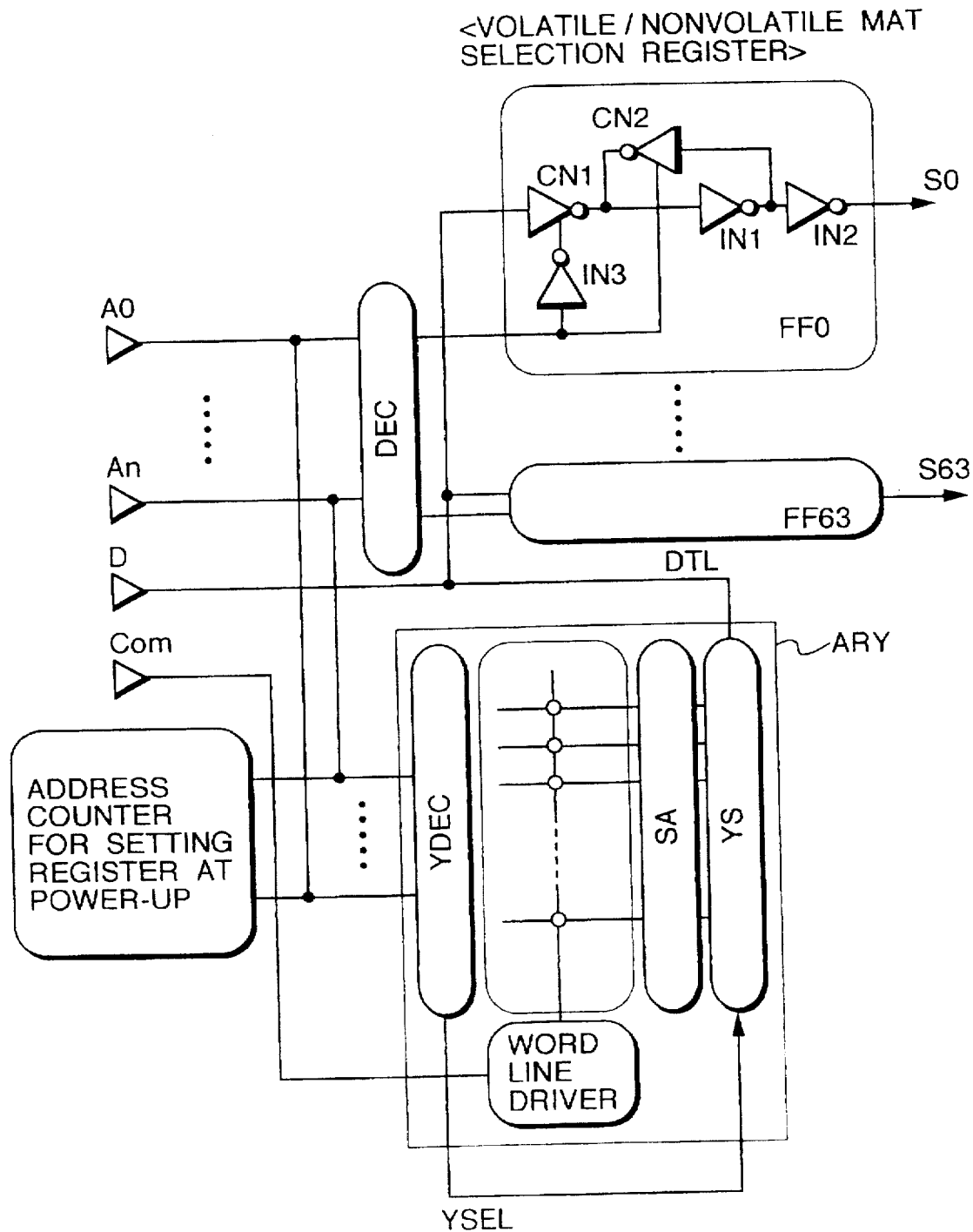
FIG. 5(A) is a schematic circuit diagram showing an embodiment of a volatile/nonvolatile mat selection register and its selection circuit provided in the semiconductor memory device of this invention.
FIG. 5(B) is a schematic circuit diagram showing another embodiment of a volatile/nonvolatile mat selection register and its selection circuit provided in the semiconductor memory device of this invention.
Figure 5:
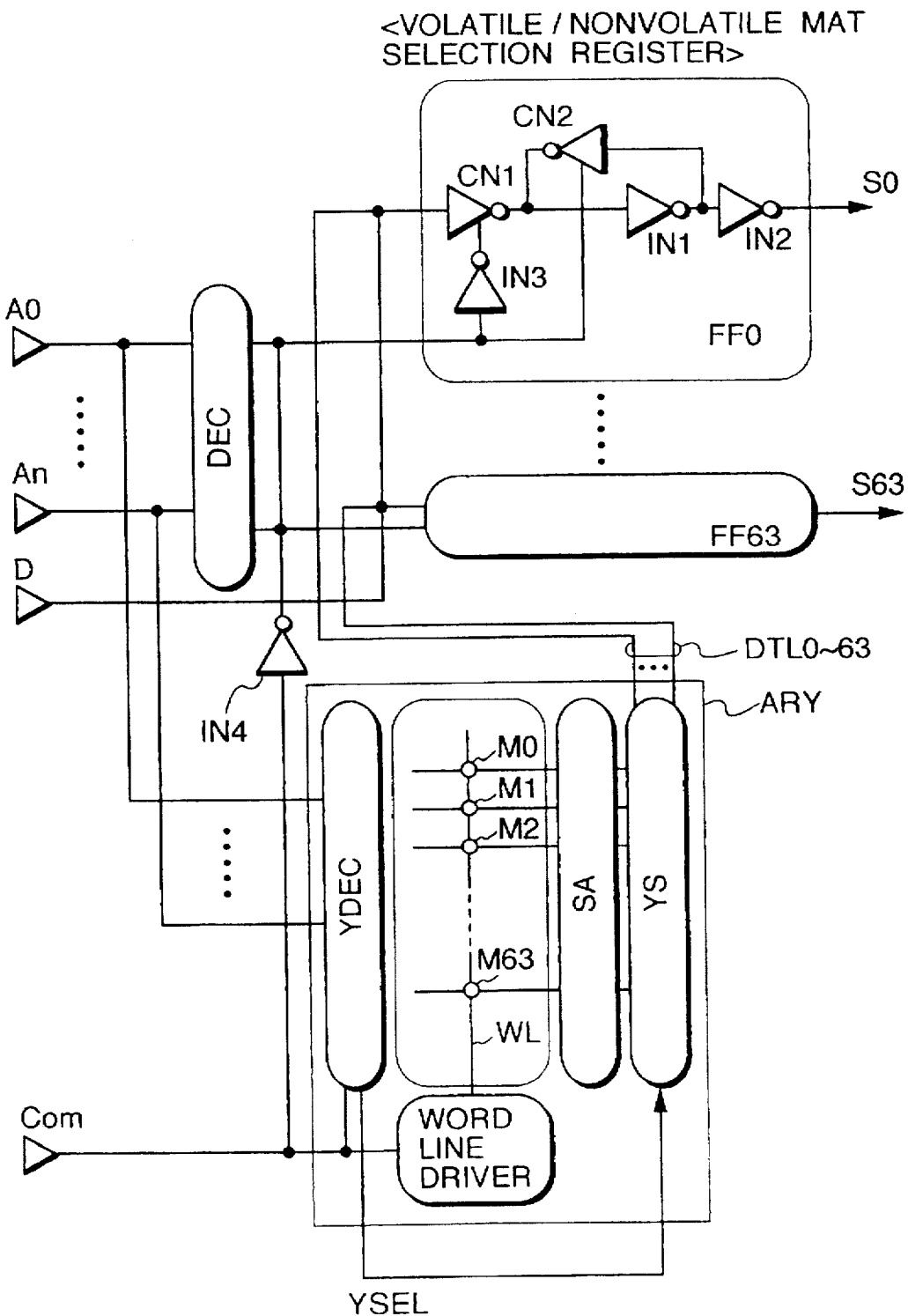

FIG. 5 (A) show a schematic circuit diagram showing one embodiment of the volatile/nonvolatile mat selection register and its selection circuit provided in the semiconductor memory device of this invention. The selection circuit includes a peripheral circuit that performs the volatile/nonvolatile state setting for the volatile/nonvolatile mat selection register and also the automatic setting immediately after the power is turned on.

The volatile/nonvolatile mat selection register, if the number of memory mats is 64 as mentioned above, has the corresponding number of flip-flops FF0–FF63. As the circuit of one flip-flop FF0 is representatively shown, the volatile/nonvolatile mat selection register uses a through latch circuit, which includes a clocked inverter CN1 as an input circuit for taking in data supplied through a data terminal D and corresponding to the volatile/nonvolatile state, an inverter IN1 for storing a signal taken in through the input circuit CN1, a clocked inverter CN2 for feeding the output signal of the inverter IN1 back to the input, and an output inverter IN2 which, upon receiving the output of the storage inverter IN1, produces a selection signal SO for selecting the plate voltage of either Vcc/2 or Vss.

A decoder DEC is provided which decodes an address signal supplied through external terminals A0–An or a register setting address signal generated by an address counter that is activated when power is turned on. This decoder DEC of this embodiment produces a selection signal corresponding to one of the 64 flip-flops FF0–FF63. This selection signal is supplied to the clocked inverter CN2 for feedback and is inverted by an inverter IN3 before being sent to the clocked inverter CN1 for input.

Under the normal operating condition, the level of the output signal of the decoder DEC is held low, representing the nonselected state. The clocked inverter CN2 for feedback is activated by the low-level signal to feed back the output signal of the inverter IN1 to the input side. Thus a positive feedback loop is formed, and consequently the information is held. At this time, because the clocked inverter CN1 for input is deactivated by the high-level output signal from the inverter IN3, its output assumes the high-impedance state, exerting no influence at all on the information holding operation. When the level of the output signal of the decoder DEC is held high, representing the selection state, the feedback clocked inverter CN2 becomes into the output high impedance state and the clocked inverter CN1 for input is activated to take in a write signal supplied to the input terminal.

When only a register as shown above is used, it is necessary, each time power is turned on, to specify the flip-flops FF0–FF63 and to allow them to store low/high level volatile/nonvolatile state information fed through the data terminal D. This degrades the convenience of use of the memory device. Therefore, information on the volatile/nonvolatile state for each memory mat is written through the external terminals A0–An and data terminal D only during the initial setting. In formation is written in, other than the flip-flops FF0–FF63, an array ARY whose plate voltage VPL is set to Vcc/2 at all times.

The above array ARY for automatic setting has one word line, bit lines whose number corresponds at least to the number of the memory mats, a sense amplifier, a word line driver, a Y decoder YDEC, and Y switches YS connected between the sense amplifier SA and each of the flip-flops FF0–FF63 to send one of the output data of the sense amplifier SA to a data transmission line DTL in response to a selection signal YSEL output from the Y decoder YDEC.

During the initial setting or immediately after the power-up, a control signal Com is generated to perform the word line selection. During the initial setting, the setting information on the volatile/nonvolatile state inputted through the data terminal D is written both into the flip-flops FF0–FF63 and into the automatic setting array simultaneously.

By this arrangement, generating an address signal by the address counter immediately after the power is turned on brings the array and the flip-flops into the selected state at the same time, causing the information stored in the array to be transferred to the flip-flops, and thus enabling the automatic setting of the volatile/nonvolatile state corresponding to the initial setting. This configuration allows the initial setting to be re-done arbitrarily according to the system modification and to the kind of data processing to be performed, further improving the convenience of use, compared to the configuration such as fuses described above that programed only once.

FIG. 5(B) shows a schematic circuit diagram of another embodiment of the volatile/nonvolatile mat selection register and its selection circuit provided in the semiconductor memory device of this invention. The difference between FIG. 5(A) and FIG. 5(B) will be described below. Consider a case where the volatile/nonvolatile memory array allotment data is first entered successively through the external terminals (address input terminals) A0–An and the data terminal D into memory cells m0–m63 in the array ARY (second memory circuit), and then the power of the semiconductor memory device is turned off and turned on again later. When the power is turned on, a high-level control signal is entered through the control signal input terminal Com. The word line driver receives the control signal and holds the word line WL at a selection level. The sense amplifier SA amplifies the data read from the memory cells m0–m63. In response to the control signal, the Y decoder YDEC outputs to the Y switch YS a selection signal YSEL that causes the Y switch YS to perform the control of transferring at a time the amplified data of the sense amplifier SA to the corresponding data transmission lines DTL0–63. The inverter IN4 inverts the control signal entered through the control signal input terminal Com and sends the inverted signal to the inverters CN2, IN3 of each flip-flop FF0–FF63. Thereafter the level of the control signal input terminal Com is held low. This control process allows the data of the memory cells m0–m63 in the array ARY to be transferred at a time to the flip-flops FF0–FF63 when power is turned on. The flip-flops FF0–FF63 therefore can receive and latch the volatile/nonvolatile state information at substantially the same timing. In FIG. 5(A), at the time of power-on, the data transfer from the memory array ARY to the flip-flops FF0–FF63 is repetitively performed 64 times, whereas in FIG. 5(B) the data transfer is done only once (parallel transfer). The method of FIG. 5(B) therefore can reduce the time taken to put data in the flip-flops FF0–FF63 upon turning on the power, making it possible to reduce the turn-on and set-up time of the semiconductor memory device.

Figure 6:
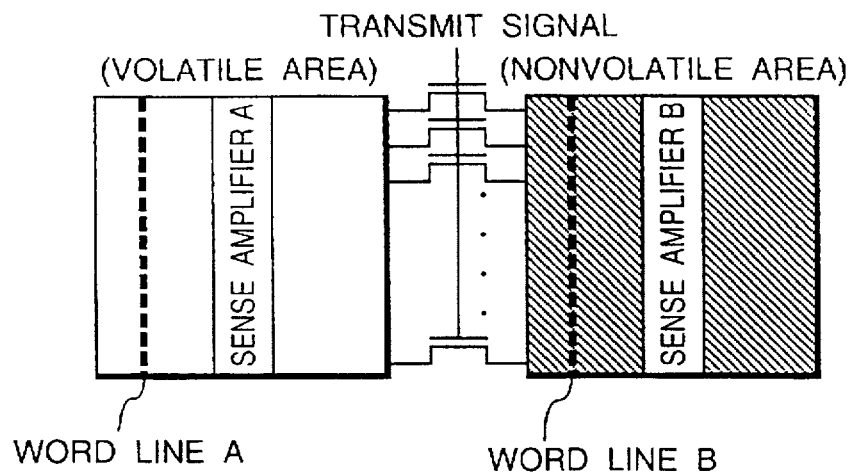
FIG. 6 is a schematic structural view showing another embodiment of the semiconductor memory device of this invention.

FIG. 6 shows a schematic structural view showing another embodiment of the semiconductor memory device of this invention. In this embodiment, a memory mat set in the volatile area and a memory mat set in the nonvolatile area are arranged side by side, and switch MOSFETs for data transfer are provided between the bit lines (data lines) of the two memory mats. Take for example a case where the word line A in the volatile region A is selected to cause the sense amplifier A to read and amplify data. After this, the word line B in the nonvolatile area B is selected and a transfer signal is simultaneously generated to connect the bit lines between the two memory mats. This causes a large-amplitude signal amplified by the sense amplifier A to be transferred onto the bit lines in the nonvolatile area, write operation for the nonvolatile area B in units of a word line is performed.

When this function is provided, data processing is done by using the volatile area to rewrite data as required. Before turning off power after the data processing has been finished, the volatile area is refreshed and, a little later, the nonvolatile area is also refreshed. This allows data transfer to be performed relatively easily. Conversely, immediately after the power is turned on, the similar data transfer is performed from the nonvolatile area to the volatile area to easily recover the state before the power cut-off. Although it has been described that the data transfer between the nonvolatile area and the volatile area is performed immediately after the power is turned on and before the power is cut off, it is possible to perform the data transfer at other timings as required.

Figure 7A:
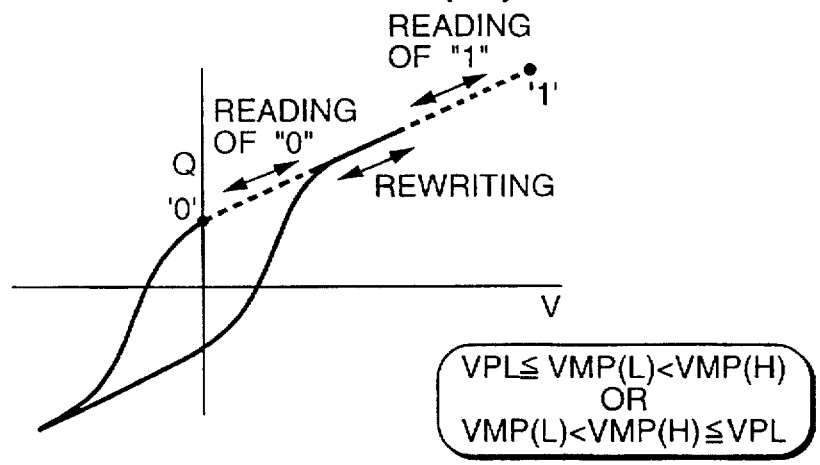
FIG. 7(A) and 7(B) are characteristic diagrams for explaining the operation state of a memory cell in the volatile mode and the nonvolatile mode in the semiconductor memory device of this invention.
Figure 7B:
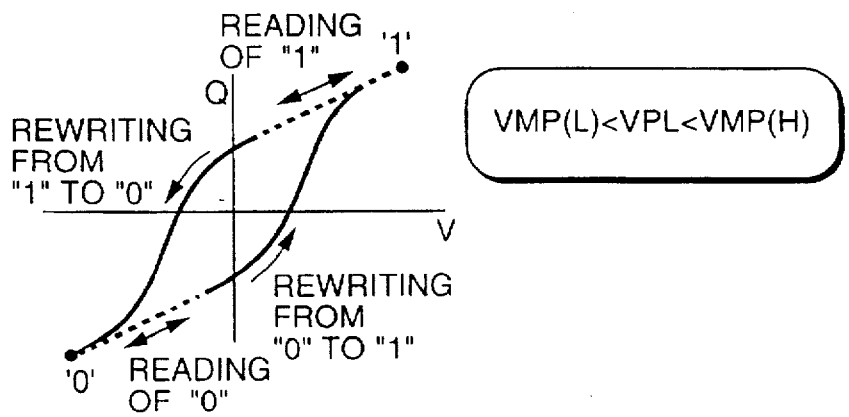

FIG. 7(A) and 7(B) show characteristic diagrams for explaining the operation states of a memory cell in the volatile mode and the nonvolatile mode in the semiconductor memory device of this invention. FIG. 7(A) is a characteristic diagram of the volatile mode operation and FIG. 7(B) is a characteristic diagram of the nonvolatile mode operation.

The condition of the volatile mode of FIG. 7(A) is as follows. Let VPL be the plate voltage, VMP(H) be the high-level voltage of bit line and VMP(L) be the low-level voltage. As shown in the figure, the relation $VPL \leq VMP(L) < VMP(H)$ or $VMP(L) < VMP(H) \leq VPL$ holds. If, as in the previous embodiment, VPL is set to VSS, VMP(L) is VSS and VMP(H) is Vcc, this satisfies the former inequality. Under this condition, as shown in FIG. 7(A), the direction of polarization is the same and the reading of "0," reading of "1" and rewriting are performed. The latter inequality is met when, for example, the VPL is set to Vcc. In this case, the polarization is constantly in the negative direction, opposite to the direction of FIG. 7(A). In a state of this negative direction, the reading of "0", reading of "1" and rewriting are performed similarly.

This will be described in more detail.

When the capacitor is in the first polarization state, and when a third voltage is applied to one of the paired electrodes of the capacitor and a second voltage is applied to the other electrode (plate electrode), the capacitor polarization is not inverted.

When the capacitor is in the first polarization state, and when a fourth voltage is applied to one of the paired electrodes of the capacitor and a second voltage is applied to the other electrode, the capacitor polarization is not inverted.

When the capacitor is in the second polarization state, and when the third voltage is applied to one of the paired electrodes of the capacitor and the second voltage is applied to the other electrode, the capacitor polarization is not inverted.

When the capacitor is in the second polarization state, and when the fourth voltage is applied to one of the paired electrodes of the capacitor and the second voltage is applied to the other electrode, the capacitor polarization is inverted.

For example, the second voltage may be set to a ground potential Vss, the third voltage to the ground potential Vss and the fourth voltage to the power supply voltage Vcc.

The condition of the nonvolatile mode of FIG. 7(B) is as follows. As in the previous case, let VPL be the plate voltage, VMP(H) be the high-level voltage of bit line, and VMP(L) be the low-level voltage. Then the relation VMP(L)<VPL<VMP(H) holds, as shown in the figure. It is noted, however, that the voltage differences between the VPL and VMP(L) and between VPL and VMP(H) are of course greater than the threshold voltage at which the polarization can be inverted. When the VPL is set to Vcc/2 as in the previous embodiment, the inequality is satisfied. In this case, the reading of "1" is performed when the polarization is in the negative direction, the reading of "0" is performed when the polarization is in the positive direction, and rewriting from "1" to "0" causes the positive direction of polarization to be changed to the negative direction of polarization. Conversely, rewriting from "0" to "1" causes the negative direction of polarization to be changed to the positive direction of polarization.

This will be explained in more detail.

When the capacitor for storing information is in the first polarization state, and when a third voltage is applied to one of the paired electrodes of the capacitor and a first voltage is applied to the other electrode (plate electrode), the capacitor polarization is inverted.

When the capacitor is in the first polarization state, and when a fourth voltage is applied to one of the paired electrodes of the capacitor and the first voltage is applied to the other electrode, the capacitor polarization is not inverted.

When the capacitor is in the second polarization state, and when the third voltage is applied to one of the paired electrodes of the capacitor and the first voltage is applied to the other electrode, the capacitor polarization is not inverted.

When the capacitor is in the second polarization state, and when the fourth voltage is applied to one of the paired electrodes of the capacitor and the first voltage is applied to the other electrode, the capacitor polarization is inverted.

For example, the first voltage is set to a substantially intermediate voltage Vcc/2 between the ground potential Vss (GND) and the power supply voltage Vcc, the third voltage to the ground potential Vss, and the fourth voltage to the power supply voltage Vcc.

In other words, in the volatile mode where the first voltage is applied to the other electrode (plate electrode) of the capacitor, the capacitor polarization is invertible a plurality of times. And in the nonvolatile mode where the second voltage is applied to the other electrode (plate electrode) of the capacitor, the capacitor polarization is not made invertible a plurality of times.

Switching between the nonvolatile mode and the volatile mode is achieved by fixing the low-level VMP(L) and high-level VMP(H) to VSS and Vcc, respectively, and changing the plate voltage VPL to VSS (or Vcc) and Vcc/2. The switching may be achieved by fixing the VPL to, say, VSS, and by providing a control circuit which, in the nonvolatile mode, sets the low-level VMP(L) of the binary write signals given to the bit lines to −Vcc/2 and the high-level VMP(H) of the binary write signals to +Vcc/2, and, in the volatile mode, sets the low-level VMP(L) of binary write signals to VSS and the high-level VMP(H) of binary write signals to +Vcc. In this case, however, the potential of the bit lines needs to be shifted in the negative direction by Vcc/2 in the nonvolatile mode. For this purpose, the operating voltage of the sense amplifier is set to −Vcc/2 and Vcc/2 and the precharge voltage of the bit lines is correspondingly changed to VSS.

Alternatively, it is possible to set the low-level VMP(L) to VSS and the high-level VMP(H) to Vcc in the nonvolatile mode and, in the volatile mode, to set the low-level VMP(L) to Vcc/2 and the high-level VMP(H) to 3Vcc/2. In this case, however, the bit line potential must be shifted in the negative direction by Vcc/2 in the nonvolatile mode. For this purpose, the operating voltage of the sense amplifier is raised to VSS and 3Vcc/2 and the bit line precharge voltage is correspondingly changed to Vcc. While this voltage setting is most easy to understand, a similar mode switching can of course be achieved also by generating a negative voltage or step-up voltage corresponding to the threshold voltage required for the inversion of polarization.

As described above, if the high-level/low-level potentials of the bit lines in the volatile mode are different from those in the nonvolatile mode, the voltage required for the operation of the sense amplifier and the precharge voltage are switched by a switch that is controlled according to the operation mode, instead of the switch of the embodiment of FIG. 3 for the plate voltage VPL. Then, a negative voltage generation circuit and a step-up voltage generation circuit are provided to produce the operating voltage of the sense amplifier. The operating voltage required for the sense amplifier may be supplied through an external terminal.

Figure 8:
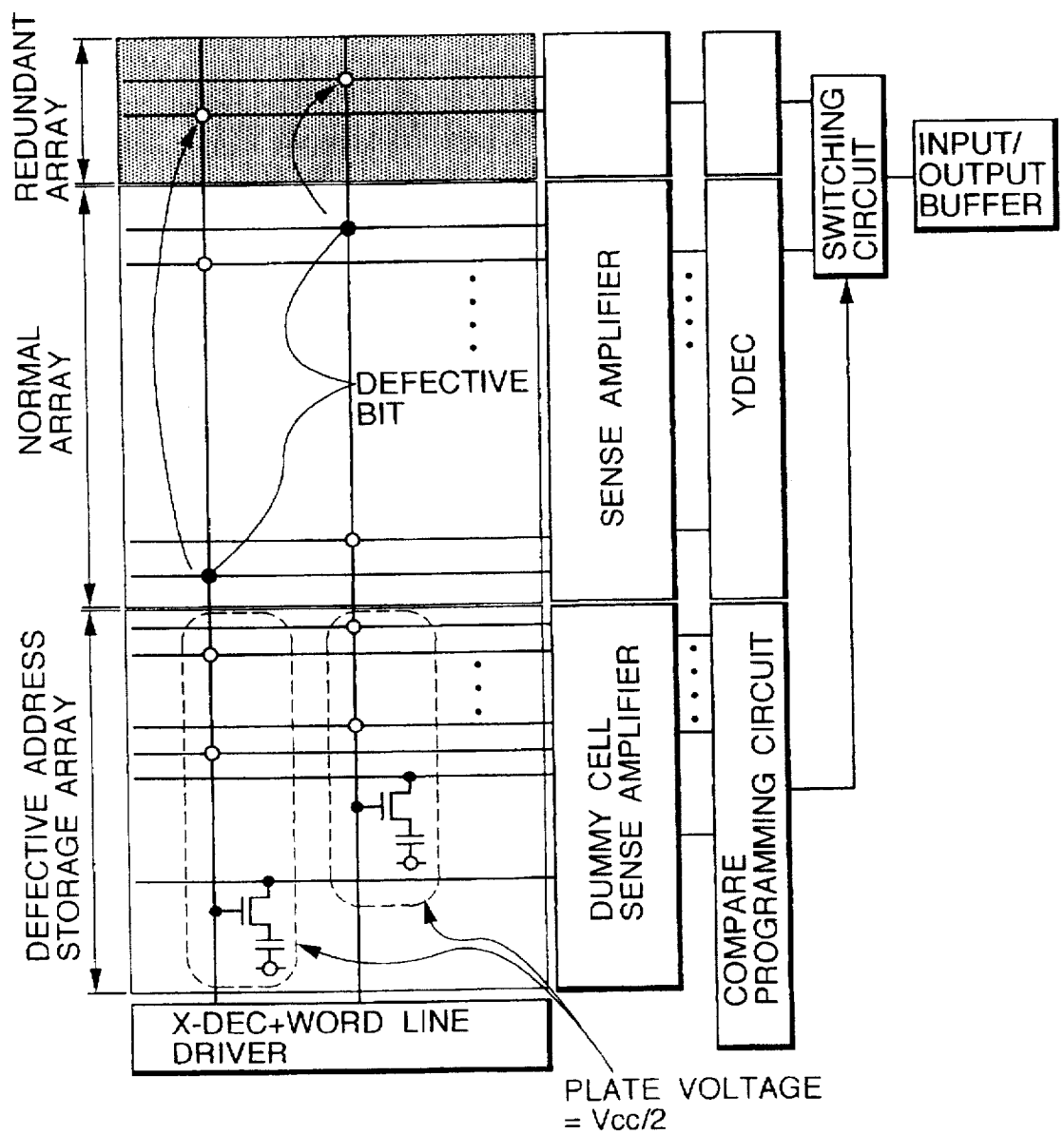
FIG. 8 is a schematic circuit diagram showing a further embodiment of the semiconductor memory device of this invention.

FIG. 8 shows a schematic circuit diagram showing a further embodiment of the semiconductor memory device of this invention. This embodiment uses the memory cells, made nonvolatile by the ferroelectric film, as a defective address storage memory for relieving memory defects. While this embodiment comprises one memory array, it may actually comprises a plurality of mats or be divided in blocks according to the memory capacity. Alternatively, it may be understood that the drawing shows functionally one of a plurality of divided memory arrays and its address selection circuit.

The X-address buffer and Y-address buffer not shown take in address signals entered in time series through the address terminal mentioned above in response to address strobe signals (RAS, CAS) that are supplied through the control terminals in synchronism with the address signals. The X-address signal taken into the X-address buffer in synchronism with the row address strobe signal (RAS) is decoded by the X-decoder XDEC to select one word line through the word line driver. The Y-address signal taken into the Y-address buffer in synchronism with the column address strobe signal (CAS) is supplied to the Y-decoder YDEC, where the address signal is decoded to generate a bit line selection signal.

In the figure, signal lines are drawn to extend from the Y-decoder YDEC to the memory array to depict the memory cells specified by the Y address. In fact the memory array is provided with complementary bit lines, which are connected to the input/output lines I/O through column switches. The Y-decoder YDEC generates a selection signal to select the column switch.

In this embodiment, the memory array as a dynamic RAM comprises a normal array as a normal circuit and a redundant array that relieves defects in units of one bit. The redundant array may have a conventional redundant circuit, not shown, that relieves defects in units of one bit line. When a defective address is selected, a redundant switching circuit, which has a comparison circuit for comparing a Y-address signal with the information on defective Y-addresses stored in a memory circuit, switches the bit line in the normal array to the redundant bit line. The memory circuit for defective Y-addresses may, for example, comprise fuses as in the conventional memory.

The normal array and the redundant array are activated in the volatile mode by fixing the plate voltage to VSS. That is, these normal and redundant arrays are used as the dynamic RAM memory arrays. The sense amplifiers provided for each array amplify very weak memory information read onto the complementary bit lines in the memory arrays and refresh those memory cells whose memory electric charged are nearly lost by the read operation. When the shared sense amplifier system mentioned before is adopted, the sense amplifier is located at the center with memory arrays or memory mats arranged on its left and right side. Because the sense amplifier performs the amplification of the read signals and the refresh of the memory cells, it uses a CMOS latch circuit whose operation is controlled by the same timing signals as used in the sense amplifier for conventional dynamic RAMs.

In the figure the input/output lines included in the Y-decoder YDEC extend in a longitudinal direction to be selectively connected to the bit lines of the memory array through the column switches. These input/output lines are connected to the I/0) (input/output) buffer via a switching circuit provided for relieving random defects of individual bits.

The word lines for the normal array are provided with memory cells, which are activated in the nonvolatile mode by setting the plate voltage to Vcc/2. These memory cells operated in the nonvolatile mode are used as a defective address storage array. When there is a defective bit in the normal array connected to the word lines to which the bad address storage array is coupled, the defective address storage array stores the Y-address corresponding to the defective bit. That is, the output signals of the X-decoder XDEC, i.e., the word lines of the dynamic RAM are connected with memory cells that are used substantially as a programmable ROM operated in the nonvolatile mode, thereby simplifying the address selection circuit of the ferroelectric memory cells that are operated as a programmable ROM. For example, 12 bit lines are made to cross the word lines of the memory array, and at their intersections there are provided the above-mentioned memory cells that are operated in the volatile mode.

In this configuration, the X-address in the dynamic RAM normal array is selected, and simultaneously the defective address storage array used as the programmable ROM is accessed to retrieve an I/0 signal corresponding to the defective Y-address from the 12 bit lines. This signal is amplified by the sense amplifier SA2 and fed to one input of the comparison circuit where the signal is compared with the Y-address signal output from the Y-address buffer.

When the memory cells are formed by using ferroelectric film as mentioned above and the volatile and nonvolatile modes are switched by setting the plate voltage VPL, it is possible to use the memory cells of the same structure so as to form both the defective address storage array which is made to function as a programmable ROM for storing defective addresses and normal and redundant arrays. It is noted, however, that the area of the memory used as the programmable ROM has a plate electrode separately from that for the areas used in the normal and redundant modes so that it can be operated in the nonvolatile mode. The normal array and redundant array need to not necessarily be operated in the volatile mode. That is, while the defective address storage array must be in the nonvolatile mode in order to store defective addresses, the normal array and redundant array can be operated in the nonvolatile mode if so required. When the normal array and redundant array are operated in the nonvolatile mode, the plate voltages are set to the same Vcc/2, so that the electrical isolation mentioned above is not required.

When one random defective cell exists on a specific word line as mentioned above, the defective address storage array, which is operated as the programmable ROM, stores the Y-address of the address which corresponds to the word line and at which a defective cell exists. When there is no defective cell on the word line, the write operation is not performed and the Y-address is set to the initial data, for example, all 0. Hence, if there are no defects on each word line, a defective cell is deemed to exist at an address corresponding to the Y-address of all 0, resulting in the selection of the redundant array instead of the normal array.

Another method for solving this problem may be adopted in which a one-bit flag is added to the Y-address to be stored and "1" is written into this bit to indicate that the Y-address stored is a defective address. In this case, the output signal of the comparison circuit is made valid only when the flag output from the defective address storage array is "1". This method prevents a defective cell from being assumed to exist at an address corresponding to the initial data in the memory cell of the defective address storage array when in fact there is no defect in each word line.

In the figure, when a random defective cell exists at a location marked with a black circle, the defective address storage array is specified by the word line (X-address) having the defective cell and stores the Y-address on the word line. With this configuration, even the dynamic RAM with a large memory capacity of as large as about 16 Mbits can be handled simply by storing the 12-bit Y-address for a single defective cell. In the above dynamic RAM, because the X-address is about 4K, the defective address storage array need only to have a small memory capacity of 4K×12= 48K bits.

On condition that each of about 4K such word lines has up to one defective cell, about at most 4K bits of defective cells can be relieved by a defective address storage array with a memory capacity of 48K bits, one comparator CMP that performs 12-bit comparison, and a redundant array having one column of redundant cells. In this case, if a defective cell occurs on a redundant bit line used for relieving defective bit lines by one line, they can be relieved. By adopting this method of specifying defective addresses, it is possible to simplify the memory circuit for identifying the random defective culls and also to significantly simplify the comparison circuit that detects an access to defective cells.

The X-address selection of the dynamic RAM of this embodiment results in simultaneous access to the normal array where defects exist and to the redundant array. When the Y-address signal of the normal array is inputted and a cell is found defective, switching of the cell is performed by the switching circuit. That is, because a defective cell is switched to a redundant cell by making use of the Y-address selection time, the memory access time can be shortened. Further, because the time difference between the access time of when a defect exists and the access time of when no defect exists, the memory access in the case of defect relief can be speeded up.

In this embodiment since the defective address storage array uses ferroelectric memory cells as described above, information can be written into it in a manner similar to the write into the normal array. This enables the writing of the defective memory address to be performed very easily. Furthermore, when the semiconductor memory device of this invention is mounted on a system and if defective memory cells occur, the provision of the aforementioned mode for writing information into defective memory addresses allows defect relief on the system.

The memory area operated as the programmable ROM may also be used to store key information as well as bad addresses. For this purpose, the normal array and the redundant array are taken to be a first memory array and a second memory array, respectively, either of which can be selectively accessed according to the key information.

That is, if the key information is entered beforehand into the comparison area for memory access, it is possible to access the second memory array corresponding to the redundant array. This access may be performed, for example, to inhibit access to the second memory area by a third party who knowledge of the key information. Alternatively, two storage areas may be provided in the same address space to allow input/output of different kinds of data while accessing the same address space by inputting the key information. Because the key information can be assigned for every bit line, it is possible to access either the first memory area or the second memory area according to the specified Y-address, if the Y-address is allocated for setting the key information similarly to the defect relief described before.

Figure 9:
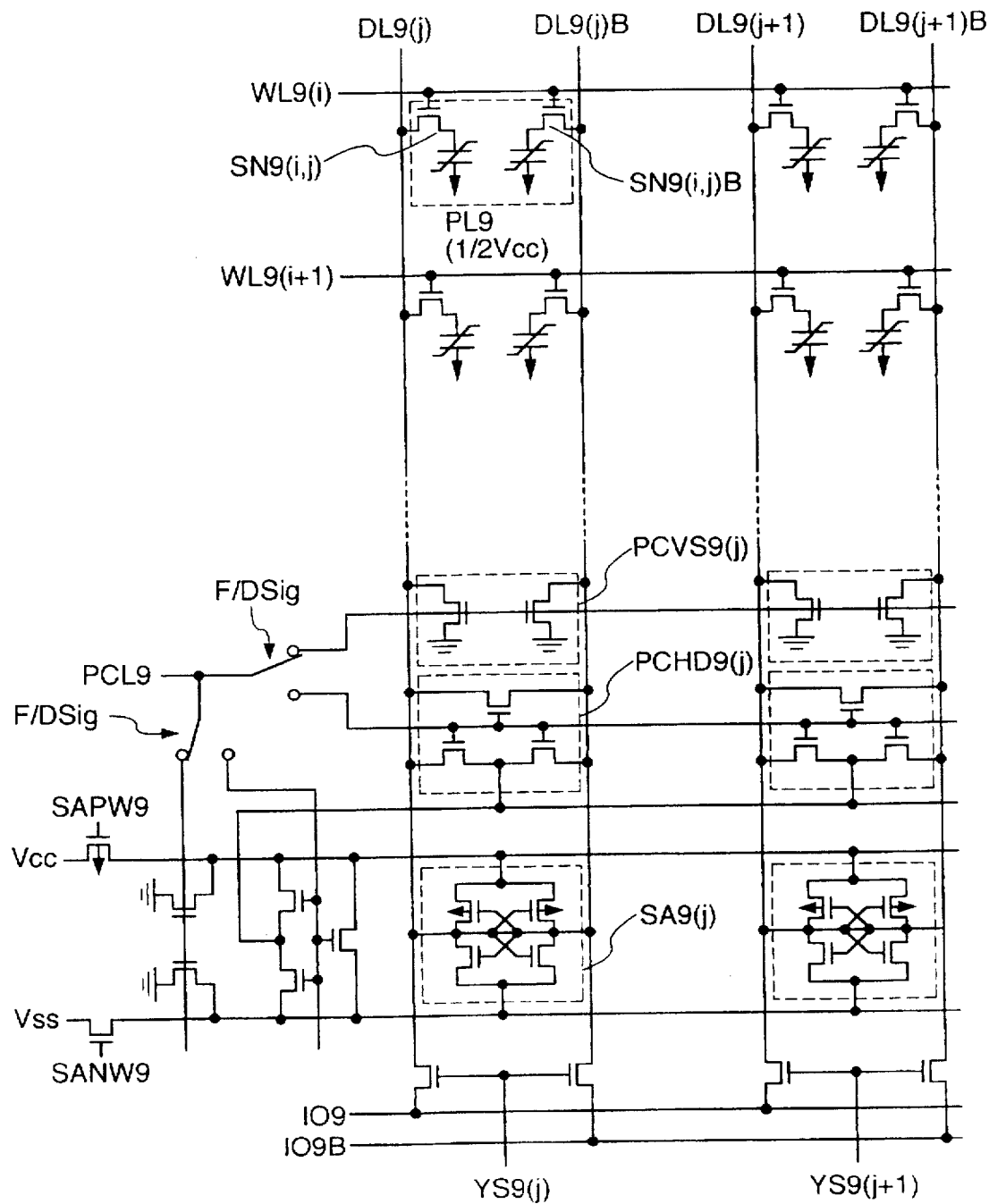
FIG. 9 is a circuit diagram showing another embodiment of the memory array in the semiconductor memory device of this invention.

FIG. 9 is a circuit diagram showing a further embodiment of the memory array of the semiconductor memory device according to this invention. The memory array of this embodiment is almost similar in configuration to the aforementioned DRAM. The capacitor film of the memory cell is made of ferroelectric as in the previous embodiment and, when power supply is turned off, can store nonvolatile information in the form of the direction of spontaneous polarization of the ferroelectric. After the power is turned on, the nonvolatile information can be converted into volatile information in the form of potentials of, say, node SN9(i,j) on the bit line side of the capacitor.

In this embodiment, two MOSFETs and two capacitors make up a memory cell. The directions of polarization and node potentials of the two capacitors are complementarily set and this setting is detected by a differential sense amplifier SA9(j). The memory cell may also be formed of one MOSFET and one capacitor, as shown in FIG. 4. In this case, a dummy cell is provided in the ferroelectric memory mode. That is, though not shown in the embodiment of FIG. 4, two dummy word lines are provided and a dummy cell is provided between the complementary bit lines.

In this embodiment, when the level of the signal F/DSig is low, i.e., when the mode is the ferroelectric memory mode (nonvolatile mode), the precharge levels for the drive line of sense amplifier SA9(j) and for bit line DL9(j) are set to 0 V. On the other hand, when the level of the signal F/DSig is high, i.e., when the mode is the DRAM mode (volatile mode), the precharge levels for the drive line of sense amplifier SA9(j) and for bit line DL9(j) are set to Vcc/2.

The above operation is performed by connecting the precharge signal line PCL9 either to the 0-V precharge circuit PCVS9(j) or to the Vcc/2 precharge circuit PCHD9(j) according to the level of the F/DSig. With the memory array of this embodiment, the reading (recovery) of nonvolatile information in the nonvolatile mode after the power is turned on can be performed in the same way as of the read operation in the volatile mode.

In the nonvolatile mode, since the memory device can be normally operated as a DRAM with the plate voltage Vcc/2 and the bit line precharge level Vcc/2, there is no inversion of polarization of the ferroelectric capacitor film due to information readout, thereby eliminating degradation of film and readout speed lowering caused by polarization inversion. Because the potential of the capacitor node and the polarization direction of the ferroelectric capacitor film always correspond to each other, the memory device, though operated apparently as a DRAM, can retain the nonvolatile information even when the power is turned off. The memory device of this embodiment therefore performs the nonvolatile operation, which can cope with inadvertent power cutoff.

Figure 10:
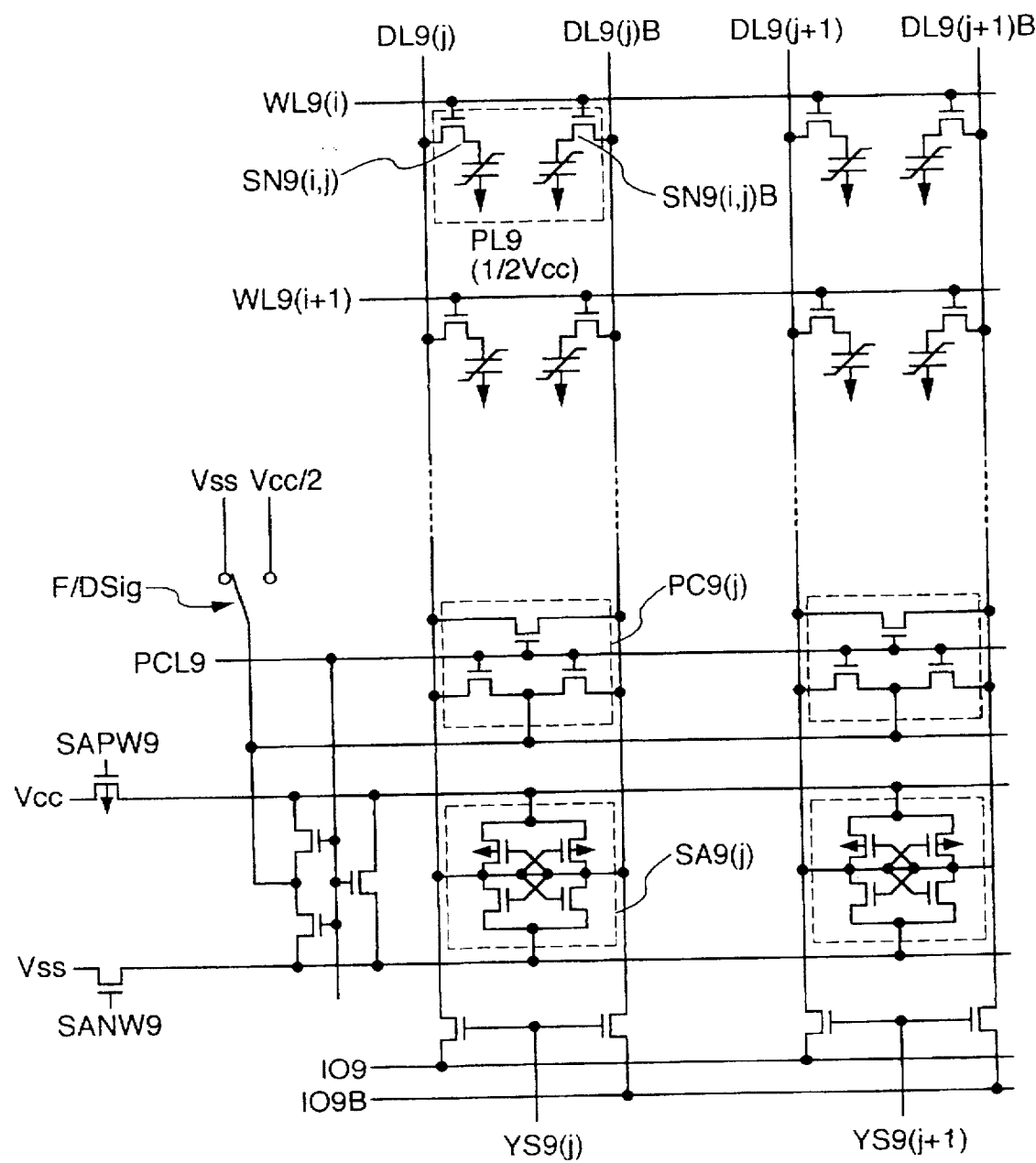
FIG. 10 is a circuit diagram showing a further embodiment of the memory array in the semiconductor memory device of this invention; and operation of the semiconductor memory device of this

FIG. 10 is a circuit diagram showing a further embodiment of the memory array in the semiconductor memory device according to this invention. Unlike the embodiment of FIG. 9, this embodiment has a precharge circuit PC9(j) common to both 0-V precharge and Vcc/2 precharge levels, and the power line for the precharge level is switched to 0 V (VSS) or Vcc/2 by the signal F/DSig.

Figure 11:
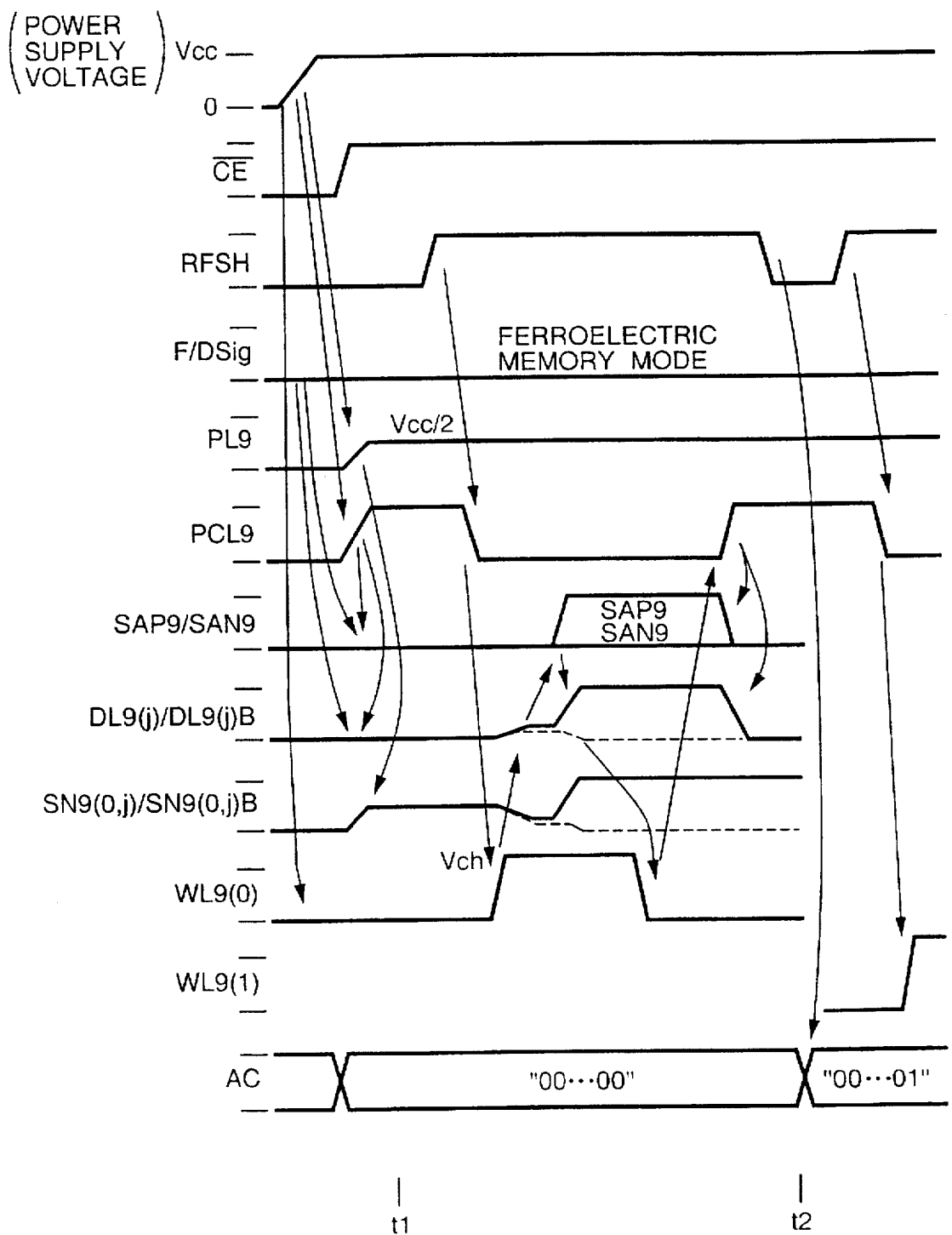
FIG. 11 is a waveform diagram showing the invention.

FIG. 11 is a waveform diagram showing the operation of the semiconductor memory device of this invention. The figure represents the operation waveforms of the embodiments of FIG. 9 and FIG. 10 in the ferroelectric memory mode when power is turned on. When power is turned on, the plate potential PL9 reaches the Vcc/2 level as in the case of the ordinary DRAM. In the mean time, because the potential of the word line such as WL9(0) is held at 0 V, or the nonselection level, the potential of the storage nodes such as SN9(0,j), SN9(0,J)B on the bit line side of the ferroelectric capacitors are raised to near Vcc/2 as the plate voltage PL9 rises.

The storage nodes such as SN9(0,j), SN9(O,J)B are in floating states because the MOSFETs are turned off according to the selection level of the word line WL9(0), so that any high voltage is not applied to the ferroelectric capacitor even when the plate voltage PL9 increases, preventing the nonvolatile information in the form of direction of polarization of the ferroelectric capacitor film from being destroyed.

Because the level of the precharge signal line PCL9 is high and that of the signal F/DSig is low, the drive line of sense amplifier SA9(j) and the bit line DL9(j) are precharged to 0 V. The address counter is initialized to 0. At time t1 when the signal lines, power line and address counter are stable at their initial states, the recall operation is started. That is, when the signal CE is at a high level, or in the chip selection state, the level of the signal RFSH is held high to start the refresh operation.

For the memory device whose the refresh operation is started by CBR (CAS before RAS refresh), the refresh mode is set up by CBR. Once the above refresh mode is set up, the signal PCL9 goes to the low level and the bit line becomes in the floating state of 0 V.

The level of the word line WL9(0), for instance, is set to Vch, which is higher than Vcc. Because the potentials of the bit lines DL9j), DL(J)B are 0 V and those of the storage nodes SN9(0,j), SN9(O,j)B of the capacitors are near Vcc/2, the bit line potential is raised to an intermediate value between 0 V and Vcc/2 according to the ratio of the capacitor's capacitance to the bit line parasitic capacitance. At this time because the polarization directions of the two complementary capacitors are opposite, a potential difference occurs between the bit line pair DL9(j) and DL9(j)B. The reason is that the potential of the plate PL9 is Vcc/2, so that electric fields of the same directions are applied to the two capacitors respectively, causing their polarizations to be in the same direction. The capacitor whose polarization is inverted receives an excess amount of charge that compensates for the polarization charge, increasing its effective capacitance. As a result, the potential of the bit line connected to the capacitor whose polarization is inverted comes close to Vcc/2.

When such a small potential difference between the complementary bit lines occurs, the difference is sensed by the differential amplifier SA9(j). That is, the drive line SAP9 is driven to Vcc to amplify the potentials of the complementary bit lines to 0 V and Vcc. When, after the amplification, the potential of the word line WL9(0) is returned to 0 V, the storage nodes SN9(j), SN9(j)B of the capacitors retain the information, 0 V or Vcc, that corresponds to the polarization direction of the capacitor film before the power-on.

Finally, the potentials of the precharge signal line PLC9 and the sense amplifier drive line SAP9 are returned to 0 V. The recall operation for all the memory cells connected to one word line WL9(0) is finished at time t2. Then, by resetting the level of the refresh signal RFSH to the low level, the address counter increases the address signal to +1 to hold the signal RFSH high, as in the refresh operation of the DRAM. This causes the word line WL9(1) corresponding to the next address to go to the selection level, starting the recall operation of the memory cells connected to the word line WL9(1). In this way, by performing the recall (refresh) operation of all the memory cells, the nonvolatile information is recovered as signal potentials. After the recall operation, this embodiment switches the bit line voltage DL9 from the 0-V precharge to the Vcc/2 precharge level.

The advantages of the above embodiment will be summarized as follows.

(1) The semiconductor memory device comprises a plurality of memory mats, a plurality of plate electrodes provided in one-to-one correspondence with the memory mats and a plurality of memory circuits provided in one-to-one correspondence with the memory mats, wherein the memory mats each include a plurality of word lines, a plurality of bit lines and a plurality of memory cells provided at the intersections of the word lines and the bit lines, wherein the memory cells each include an information storage capacitor having a ferroelectric film, and an address selection MOSFET, wherein the information storage capacitor has a pair of electrodes, one of which is connected to the plate electrode that corresponds to the memory mat in which the information storage capacitor is included, wherein a first or second voltage is selectively applied to each of the plate electrodes according to data held in the memory circuit corresponding to the plate electrode, wherein, when the first voltage is applied to the plate electrode, the information storage capacitors connected to the plate electrode are made incapable of polarization inversion irrespective of a binary write signal given to the bit lines, and wherein, when the second voltage is applied to the plate electrode, the information storage capacitors connected to the plate electrode are made capable of polarization inversion in response to a binary write signal given to the bit lines. This configuration enables nonvolatile/volatile area to be set programmably in a single semiconductor memory device according to the kind of data handled and enables the corresponding data to be stored in a predetermined storage area. This makes it possible to provide a semiconductor memory device having a nonvolatile memory function and used with good convenience of use. Further, because the volatile area has no film fatigue caused by polarization inversion as a result of recall and rewrite operations, a highly reliable semiconductor memory device can be obtained by storing data which are frequently rewritten in the volatile area, like a main memory.

(2) The circuit for programmably setting the plate voltage to the first and second voltage is constructed of a memory circuit, an address selection circuit for decoding an address signal entered through the address terminal to select the memory circuit, and a data input circuit for inputting a binary signal representing the first or second voltage through the data terminal. This circuit allows the setting of the volatile/nonvolatile area by a software, and consequently a semiconductor memory device with good convenience of use can be obtained.

(3) The memory circuit uses a flip-flop circuit which has a one-to-one correspondence with the memory mat. The first voltage is supplied at all times to the plate electrode. The binary signal is stored in a plurality of memory cells provided to one word line. Immediately after the power is turned on, the word line selection operation is performed and the address signal for selecting memory cells and a flip-flop circuit is generated to set the information stored in the plurality of memory cells into the corresponding flip-flop circuit in synchronism with the count operation of the address counter. This makes it possible to automatically perform the volatile/nonvolatile state setting upon turning on the power.

(4) A memory mat to which the first voltage is applied and a memory mat to which the second voltage is applied are arranged side by side and, between the bit lines of these memory mats, a transfer circuit is provided which transfers signals in units of one word line. This arrangement allows high speed transfer of data between the memory mats.

(5) The first and second voltages are equalized and the write signal transferred to the bit lines is changed according to the first and second voltages. This makes it possible to use a common plate voltage.

(6) The write signal fed to the bit lines has a low level such as the circuit ground potential and a high level such as the power supply voltage. The first voltage is set to the circuit ground potential and the second voltage is set to one-half the power supply voltage. This enables the setting of the volatile/nonvolatile mode with a simple configuration.

(7) The memory circuit uses a memory means which allows programming only once. This simplifies the circuit used to set the volatile/nonvolatile area.

(8) The semiconductor memory device is provided with a plurality of memory mats, each of which has memory cells arranged in matrix at intersections of word lines and bit lines, each memory cell comprising an information storage capacitor having a ferroelectric film and an address selection MOSFET. One of the electrodes of each of the information storage capacitors making up the normal circuit and the redundant circuit formed in the memory mat is commonly connected together to form a first plate electrode. One of the electrodes of each of the information storage capacitors making up a defective address storage area that is formed in the same memory mat and stores defective Y-addresses in units of data of one word line is commonly connected together to form a second plate electrode. The potential of the first plate electrode is set to the first or second voltage, and the potential of the second plate is set to the second voltage. The first voltage is a voltage that does not allow inversion of polarization of the ferroelectric irrespective of the binary write signal transferred to the bit lines connected to the memory cells. The second voltage is a voltage that causes the inversion of polarization of the ferroelectric in response to the binary write signal transferred to the bit lines connected to the memory cells. A circuit is provided which, when the signal read out from the defective address storage area agrees with the Y-address, switches to the redundant circuit. These arrangements enable efficient relief of defects in units of one bit. When the semiconductor memory device of this invention is mounted on a system, if a defective cell is produced, a defective address write mode brings about the effect of relieving defects on the system.

(9) The semiconductor memory device is provided with a plurality of memory mats, each of which has memory cells arranged in matrix at intersections of word lines and bit lines, each memory cell comprising an information storage capacitor having a ferroelectric film and an address selection MOSFET. One of the electrodes of each of the information storage capacitors making up the first memory circuit and the second memory circuit formed in the memory mat is commonly connected together to form a first plate electrode. One of the electrodes of each of the information storage capacitors making up an memory area that is formed in the same memory mat and stores key words in units of one word line is commonly connected together to form a second plate electrode. The potential of the first plate electrode is set to the first or second voltage, and the potential of the second plate is set to the second voltage. The first voltage is a voltage that does not allow inversion of polarization of the ferroelectric irrespective of the binary write signal transferred to the bit lines connected to the memory cells. The second voltage is a voltage that causes the inversion of polarization of the ferroelectric in response to the binary write signal transferred to the bit lines connected to the memory cells. The key word is compared with a key word supplied from outside and, according to the result of comparison, either the first memory circuit or the second memory circuit is selected. With these arrangements it is possible to provide a semiconductor memory device with a novel memory access function using key words.

The present invention has been described in detail in conjunction with the embodiments. It is noted that this invention is not limited to these embodiments but a variety of modifications may be made without departing from the spirit of the invention. For example, it may be applied to semiconductor memory devices with a large capacity of 1 Gbits or to small-scale memory devices of about 16 Mbits. In relatively low-speed data processing devices, the volatile memory area may be used as a cache memory and the nonvolatile area as a main memory. For the area used as a cache memory, a direct sense system may be employed in which a very small signal of bit lines is amplified by the amplification MOSFET and fed to a differential sense amplifier, in order to increase the speed of memory access. This invention can be widely applied to semiconductor memory devices that use as memory means capacitors having a ferroelectric film.

Representative of the inventions will be briefly summarized as follows. The semiconductor memory device is provided with a plurality of memory mats, each of which has memory cells arranged in matrix at intersections of word lines and bit lines, each memory cell comprising an information storage capacitor having a ferroelectric film and an address selection MOSFET. The potential of the plate electrode, which is formed by commonly connecting one of the electrode of the information storage capacitors provided in the memory mat, is programmably set to the first voltage which does not allow the inversion of polarization of the ferroelectric irrespective of the binary write signal transferred to the bit lines connected to the memory cells, or to the second voltage which causes the inversion of polarization of the ferroelectric in response to the binary write signal transferred to the bit lines connected to the memory cells. This configuration enables nonvolatile/volatile area to be set programmably in a single semiconductor memory device according to the kind of data handled and enables the corresponding data to be stored in a predetermined storage area. This makes it possible to provide a semiconductor memory device having a nonvolatile memory function and used with good convenience of use. Further, because the volatile area has no film fatigue caused by polarization inversion as a result of recall and rewrite operations, a highly reliable semiconductor memory device can be obtained by storing data which are frequently rewritten in the volatile area, like a main memory.

The circuit for programmably setting the plate voltage to the first and second voltage is constructed of a memory circuit, an address selection circuit for decoding an address signal entered through from the address terminal to select the memory circuit, and a data input circuit for inputting a binary signal representing the first or second voltage through the data terminal. This circuit allows the setting of the volatile/nonvolatile area by a software, and consequently a semiconductor memory device which good convenience of use can be obtained.

The memory circuit uses a flip-flop circuit which has a one-to-one correspondence with the memory mat. The first voltage is supplied at all times to the plate electrode. The binary signal is stored in a plurality of memory cells provided to one word line. Immediately after the power is turned on, the word line selection operation is performed and the address signal for selecting memory cells and a flip-flop circuit is generated to set the information stored in the plurality of memory cells into the corresponding flip-flop circuit in synchronism with the count operation of the address counter. This makes it possible to automatically perform the volatile/nonvolatile state setting upon turning on the power.

A memory mat to which the first voltage is applied and a memory mat to which the second voltage is applied are arranged side by side and, between the bit lines of these memory mats, a transfer circuit is provided which transfers signals in units of one word line. This arrangement allows high speed transfer of data between the memory mats.

The first and second voltages are equalized and the write signal transferred to the bit lines is changed according to the first and second voltages. This makes it possible to use a common plate voltage.

The write signal fed to the bit lines has a low level such as the circuit ground potential and a high level such as the power supply voltage. The first voltage is set to the circuit ground potential and the second voltage is set to one-half the power supply voltage. This enables the setting of the volatile/nonvolatile mode with a simple configuration.

The memory circuit uses a memory means which allows programming only once. This simplifies the circuit used to set the volatile/nonvolatile area.

The semiconductor memory device is provided with a plurality of memory mats, each of which has memory cells arranged in matrix at intersections of word lines and bit lines, each memory cell comprising an information storage capacitor having a ferroelectric film and an address selection MOSFET. One of the electrodes of each of the information storage capacitors making up the normal circuit and the redundant circuit formed in the memory mat is commonly connected together to form a first plate electrode. One of the electrodes of each of the information storage capacitors making up a defective address storage area that is formed in the same memory mat and stores defective Y-addresses in units of data of one word line commonly connected together to form a second plate electrode. The potential of the first plate electrode is set to the first or second voltage, and the potential of the second plate is set to the second voltage. The first voltage is a voltage that does not allow inversion of polarization of the ferroelectric irrespective of the binary write signal transferred to the bit lines connected to the memory cells. The second voltage is a voltage that causes the inversion of polarization of the ferroelectric in response to the binary write signal transferred to the bit lines connected to the memory cells. A circuit is provided which, when the signal read out from the defective address storage area agrees with the Y-address, switches to the redundant circuit. These arrangements enable efficient relief of defects in units of one bit. When the semiconductor memory device of this invention is mounted on a system, if a defective cell is produced, a defective address write mode brings about the effect of relieving defects on the system.

The semiconductor memory device is provided with a plurality of memory mats, each of which has memory cells arranged in matrix at intersections of word lines and bit lines, each memory cell comprising an information storage capacitor having a ferroelectric film and an address selection MOSFET. One of the electrodes of each of the information storage capacitors making up the first memory circuit and the second memory circuit formed in the memory mat is commonly connected together to form a first plate electrode. One of the electrodes of each of the information storage capacitors making up an memory area that is formed in the same memory mat and stores key words in units of one word line is commonly connected together to form a second plate electrode. The potential of the first plate electrode is set to the first or second voltage, and the potential of the second plate is set to the second voltage. The first voltage is a voltage that does not allow inversion of polarization of the ferroelectric irrespective of the binary write signal transferred to the bit lines connected to the memory cells. The second voltage is a voltage that causes the inversion of polarization of the ferroelectric in response to the binary write signal transferred to the bit lines connected to the memory cells. The key word is compared with a key word supplied from outside and, according to the result of comparison, either the first memory circuit or the second memory circuit is selected. With these arrangements it is possible to provide a semiconductor memory device with a novel memory access function using key words.

What is claimed is:

1. A semiconductor memory device comprising:

a plurality of memory mats;

a plurality of plate electrodes provided in one-to-one correspondence with the memory mats; and a plurality of memory circuits provided in one-to-one correspondence with the memory mats;

wherein the memory mats each include a plurality of word lines, a plurality of bit lines, a plurality of memory cells provided at the intersections of the word lines and the bit lines, and a plurality of sense amplifiers connected to said bit lines;

wherein the memory cells each include an information storage capacitor having a ferroelectric film, and an address selection MOSFET;

wherein the information storage capacitor has a pair of electrodes, one of which is connected to the mat in which the information storage capacitor is included;

wherein a first voltage or a second voltage is selectively applied to each of the plate electrodes according to data held in the memory circuit corresponding to the plate electrode;

wherein, when the first voltage is applied to the plate electrode, the information storage capacitors connected to the plate electrode are made incapable of polarization reversal irrespective of a binary write signal given to the bit lines;

wherein, when the second voltage is applied to the plate electrode, the information storage capacitors connected to the plate electrode are made capable of polarization inversion in response to a binary write signal given to the bit lines, whereby said semiconductor memory device can be divided to have a volatile portion and a non-volatile portion at the same time in response to the simultaneous application of the first and second voltages to different ones of the plate electrodes.

2. A semiconductor memory device according to claim 1, further comprising:

an address terminal for receiving an address signal;

a data terminal;

a first decoder circuit for decoding the address signal to select the plurality of memory circuits;

wherein a binary signal entered through the data terminal is written into the memory circuit corresponding to the address signal.

3. A semiconductor memory device according to claim 2, further comprising:

a plurality of second memory cells;

a second decoder circuit for decoding the address signal to select the plurality of second memory cells;

an address counter which, when power is turned on, feeds a second address signal to the first decoder circuit and the second decoder circuit;

wherein data of the second memory cell corresponding to the second address signal is transferred to the memory circuit corresponding to the second address signal.

4. A semiconductor memory device according to claim 1, further comprising:

a transfer circuit connected between the bit lines of the memory mat corresponding to the plate voltage to which the first voltage is applied and the bit lines of the memory mat corresponding to the plate voltage to which the second voltage is applied, the transfer circuit being adapted to transfer data on one word line at a time.

5. A semiconductor memory device according to claim 1, wherein the binary write signal fed to the bit lines is a ground potential and a power supply voltage, the first voltage is the ground potential, and the second voltage is a substantially intermediate voltage between the ground potential and the power supply voltage.

6. A semiconductor memory device according to claim 1, wherein the binary write signal fed to the bit lines is a ground potential and a power supply voltage, the first voltage is the ground potential, and the second voltage is a voltage between the ground potential and the power supply voltage.

7. A semiconductor memory device according to claim 1, wherein the plurality of memory circuits include memory means that can be written only once.

8. A semiconductor memory device comprising:

(1) a first memory mat including a plurality of first word lines, a plurality of first bit lines, and a plurality of first memory cells provided at the intersections of the plurality of first word lines and the plurality of first bit lines;

(2) a second memory mat including a plurality of second word lines, a plurality of second bit lines, and a plurality of first memory cells provided at the intersections of the plurality of second word lines and the plurality of second bit lines;

(3) a first selection circuit connected to the plurality of first bit lines;

(4) a second selection circuit connected to the plurality of second bit lines;

(5) a first memory circuit provided correspondingly to the first memory mat; and (6) a second memory circuit provided correspondingly to the second memory mat;

wherein the plurality of first memory cells each include a first selection MOSFET and a first capacitor polarizable and having a pair of electrodes;

wherein one of the paired electrodes of the first capacitor is connected to either the source or drain of the first selection MOSFET;

wherein the plurality of second memory cells each include a second selection MOSFET and a second capacitor polarizable and having a pair of electrodes;

wherein one of the paired electrodes of the second capacitor is connected to either the source or drain of the second selection MOSFET;

wherein when data held in the first memory circuit is first data, the first selection circuit applies a first voltage or a second voltage to the plurality of first bit lines;

wherein when data held in the first memory circuit is second data, the first selection circuit applies a third voltage or a fourth voltage to the plurality of first bit lines;

wherein when data held in the second memory circuit is the first data, the second selection circuit applies the first voltage or the second voltage to the plurality of second bit lines;

wherein when data held in the second memory circuit is the second data, the second selection circuit applies the third voltage or the fourth voltage to the plurality of second bit lines.

9. A semiconductor memory device comprising:

(1) a first memory mat including a plurality of first word lines, a plurality of first bit lines, and a plurality of first memory cells provided at the intersections of the plurality of first word lines and the plurality of first bit lines;

(2) a second memory mat including a plurality of second word lines, a plurality of second bit lines, and a plurality of second memory cells provided at the intersections of the plurality of second word lines and the plurality of second bit lines;

(3) a first interconnection provided correspondingly to the first memory mat;

(4) a second interconnection provided correspondingly to the second memory mat;

(5) a first control circuit connected to the first interconnection;

(6) a second control circuit connected to the second interconnection;

(7) a first memory circuit provided correspondingly to the first memory mat; and (8) a second memory circuit provided correspondingly to the second memory mat;

wherein the plurality of first memory cells each include a first selection MOSFET and a first capacitor polarizable and having a pair of electrodes;

wherein one of the paired electrodes of the first capacitor is connected to either the source or drain of the first selection MOSFET and the other of the paired electrodes of the first capacitor is connected to the first interconnection;

wherein the plurality of second memory cells each include a second selection MOSFET and a second capacitor polarizable and having a pair of electrodes;

wherein one of the paired electrodes of the second capacitor is connected to either the source or drain of the second selection MOSFET and the other of the paired electrodes of the second capacitor is connected to the second interconnection;

wherein the first control circuit applies a first voltage or a second voltage to the first interconnection according to the data held in the first memory circuit;

wherein the second control circuit applies the first voltage or the second voltage to the second interconnection according to the data held in the second memory circuit.

10. A semiconductor memory device according to claim 9, wherein when the first capacitor is in a first polarization state and when the first voltage is applied to the first interconnection, the polarization of the first capacitor is invertable;

when the first capacitor is in a second polarization state land when the first voltage is applied to the first interconnection, the polarization of the first capacitor is invertable;

when the first capacitor is in the first polarization state and when the second voltage is applied to the first interconnection, the polarization of the first capacitor is invertable;

when the first capacitor is in the second polarization state and when the second voltage is applied to the first interconnection, the polarization of the first capacitor is not invertable;

when the second capacitor is in a first polarization state and when the first voltage is applied to the second interconnection, the polarization of the second capacitor is invertable;

when the second capacitor is in a second polarization state and when the first voltage is applied to the second interconnection, the polarization of the second capacitor is invertable;

when the second capacitor is in the first polarization state and when the second voltage is applied to the second interconnection, the second capacitor is invertable; and when the second capacitor is in the second polarization state and when the second voltage is applied to the second interconnection, the second capacitor is not invertable.

11. A semiconductor memory device according to claim 10, further comprising:

a first data line selection circuit for applying a third voltage or a fourth voltage to a plurality of first data lines; and a second data line selection circuit for applying the third voltage or the fourth voltage to a plurality of second data lines;

wherein when the first capacitor is in the first polarization state and when the third voltage is applied to one of the paired electrodes of the first capacitor and the first voltage is applied to the other of the paired electrodes of the first capacitor, the polarization of the first capacitor is inverted;

wherein when the first capacitor is in the first polarization state and when the fourth voltage is applied to one of the paired electrodes of the first capacitor and the first voltage is applied to the other of the paired electrodes of the first capacitor, the polarization of the first capacitor is not inverted;

wherein when the first capacitor is in the second polarization state and when the third voltage is applied to one of the paired electrodes of the first capacitor and the first voltage is applied to the other of the paired electrodes of the first capacitor, the polarization of the first capacitor is not inverted;

wherein when the first capacitor is in the second polarization state and when the fourth voltage is applied to one of the paired electrodes of the first capacitor and the first voltage is applied to the other of the paired electrodes of the first capacitor, the polarization of the first capacitor is inverted;

wherein when the first capacitor is in the first polarization state and when the third voltage is applied to one of the paired electrodes of the first capacitor and the second voltage is applied to other of the paired electrodes of the first capacitor, the polarization of the first capacitor is not inverted;

wherein when the first capacitor is in the first polarization state and when the fourth voltage is applied to one of the paired electrodes of the first capacitor and the second voltage is applied to the other of the paired electrodes of the first capacitor, the polarization of the first capacitor is not inverted;

wherein when the first capacitor is in the second polarization state and when the third voltage is applied to one of the paired electrodes of the first capacitor and the second voltage is applied to the other of the paired electrodes of the first capacitor, the polarization of the first capacitor is not inverted;

wherein when the first capacitor is in the second polarization state and when the fourth voltage is applied to one of the paired electrodes of the first capacitor and the second voltage is applied to the other of the paired electrodes of the first capacitor, the polarization of the first capacitor is inverted;

wherein when the second capacitor is in the first polarization state and when the third voltage is applied to one of the paired electrodes of the second capacitor and the first voltage is applied to the other of the paired electrodes of the second capacitor, the polarization of the second capacitor is inverted;

wherein when the second capacitor is in the first polarization state and when the fourth voltage is applied to one of the paired electrodes of the second capacitor and the first voltage is applied to the other of the paired electrodes of the second capacitor, the polarization of the second capacitor is not inverted;

wherein when the second capacitor is in the second polarization state and when the third voltage is applied to one of the paired electrodes of the second capacitor and the first voltage is applied to the other of the paired electrodes of the second capacitor, the polarization of the second capacitor is not inverted;

wherein when the second capacitor is in the second polarization state and when the fourth voltage is applied to one of the paired electrodes of the second capacitor and the first voltage is applied to the other of the paired electrodes of the second capacitor, the polarization of the second capacitor is inverted;

wherein when the second capacitor is in the first polarization state and when the third voltage is applied to one of the paired electrodes of the second capacitor and the second voltage is applied to the other of the paired electrodes of the second capacitor, the polarization of the second capacitor is not inverted;

wherein when the second capacitor is in the first polarization state and when the fourth voltage is applied to one of the paired electrodes of the second capacitor and the second voltage is applied to the other of the paired electrodes of the second capacitor, the polarization of the second capacitor is not inverted;

wherein when the second capacitor is in the second polarization state and when the third voltage is applied to one of the paired electrodes of the second capacitor and the second voltage is applied to the other of the paired electrodes of the second capacitor, the polarization of the second capacitor is not inverted;

wherein when the second capacitor is in the second polarization state and when the fourth voltage is applied to one of the paired electrodes of the second capacitor and the second voltage is applied to the other of the paired electrodes of the second capacitor, the polarization of the second capacitor is inverted.

12. A semiconductor memory device according to claim 9, wherein when the first voltage is applied to the other of the paired electrodes of the first capacitor, the polarization of the first capacitor is made invertable a plurality of times;

when the second voltage is applied to the other of the paired electrodes of the first capacitor, the polarization of the first capacitor is not made invertable a plurality of times;

when the first voltage is applied to the other of the paired electrodes of the second capacitor, the polarization of the second capacitor is made invertable a plurality of times; and when the second voltage is applied to the other of the paired electrodes of the second capacitor, the polarization of the second capacitor is not made invertable a plurality of times.

13. A semiconductor memory device according to claim 8, further comprising:

a first interconnection provided correspondingly to the first memory array; and a second interconnection provided correspondingly to the second memory array;

wherein the other of the paired electrodes of the first capacitor is connected to the first interconnection, the other of the paired electrode of the second capacitor is connected to the second interconnection, and a fifth voltage is applied to the first interconnection and the second interconnection.

14. A semiconductor memory device according to claim 13, wherein when the one of potentials of the first capacitor is the first voltage, the polarization of the first capacitor is made invertable;

when the one of potentials of the first capacitor is the second voltage, the polarization of the first capacitor is made invertable;

when the one of potentials of the first capacitor is the third voltage, the polarization of the first capacitor is not made invertable; and when the one of potentials of the first capacitor is the fourth voltage, the polarization of the first capacitor is made invertable.

* * * * *